(12) United States Patent
Cho et al.

(10) Patent No.: US 11,107,416 B2
(45) Date of Patent: Aug. 31, 2021

(54) DISPLAY DEVICE

(71) Applicant: SAMSUNG DISPLAY CO., LTD., Yongin-si (KR)

(72) Inventors: Seung Hwan Cho, Yongin-si (KR); Jong Hyun Choi, Seoul (KR); Ju Chan Park, Seoul (KR); Seung Min Song, Gwangju (KR); Min Seong Yi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/851,293

(22) Filed: Apr. 17, 2020

(65) Prior Publication Data

US 2020/0357345 A1 Nov. 12, 2020

(30) Foreign Application Priority Data

May 7, 2019 (KR) .................. 10-2019-0052973

(51) Int. Cl.
  *G09G 3/3275* (2016.01)
  *H01L 27/32* (2006.01)
  *H01L 51/00* (2006.01)

(52) U.S. Cl.
  CPC ....... *G09G 3/3275* (2013.01); *H01L 27/3246* (2013.01); *H01L 27/3265* (2013.01); *H01L 27/3276* (2013.01); *H01L 51/0097* (2013.01); *G09G 2300/02* (2013.01); *G09G 2370/08* (2013.01); *H01L 2251/5338* (2013.01)

(58) Field of Classification Search
  CPC ......... G09G 3/3275; G09G 2300/0426; G09G 2370/08; G09G 2380/02; G09G 2300/02; H01L 27/3276; H01L 27/3248; H01L 27/3258; H01L 27/3262; H01L 27/3265; H01L 27/1251; H01L 27/326; H01L 51/0097; H01L 2251/5338; G02F 1/133305
  See application file for complete search history.

(56) References Cited

U.S. PATENT DOCUMENTS

| 2014/0055702 | A1* | 2/2014 | Park .............. H01L 27/3279 349/43 |
| 2017/0033173 | A1* | 2/2017 | Kim .............. G09G 3/3225 |
| 2017/0357113 | A1* | 12/2017 | Yamazaki .......... G02F 1/13471 |
| 2018/0331124 | A1 | 11/2018 | Cho et al. |

FOREIGN PATENT DOCUMENTS

| KR | 10-2017-0031323 | 3/2017 |
| KR | 10-2017-0062636 | 6/2017 |
| KR | 10-2020-0031738 | 3/2020 |

* cited by examiner

*Primary Examiner* — Xuemei Zheng
(74) *Attorney, Agent, or Firm* — F. Chau & Associates, LLC

(57) ABSTRACT

A display device that includes a first area including a display area, a second area including a non-display area, and a third area connecting the first and second areas. A demultiplexing circuit unit is disposed in the non-display area of the second area and overlaps with the first area in a direction of a thickness of the display device.

20 Claims, 21 Drawing Sheets

DISPLAY DEVICE

CROSS-REFERENCE TO RELATED APPLICATION

This application claims priority under 35 U.S.C. § 119 to Korean Patent Application No. 10-2019-0052973, filed on May 7, 2019 in the Korean Intellectual Property Office, the disclosure of which is incorporated herein by reference in its entirety herein.

1. TECHNICAL FIELD

The present disclosure relates to a display device.

2. DISCUSSION OF RELATED ART

Display devices have become increasingly important with the development of multimedia technology. Accordingly, various display devices such as liquid crystal display (LCD) devices, organic light-emitting diode (OLED) display devices and the like have been developed. The OLED display device is a self-emissive display device that has attracted significant attention as a next-generation display device.

The OLED display device includes pixel circuits and a driver that drives the pixel circuitry. The driver may include a scan driver providing scan signals to the pixel circuits, a data driver providing data signals to the pixel circuits, and a demutiplexer. The scan driver and the demultiplexer may include driving circuits. The driving circuits may be arranged in a non-display area adjacent to a display area. However, the non-display area may effectively be dead space for the OLED display device in terms of functionality.

SUMMARY

Exemplary embodiments of the present inventive concepts provide a display device capable of reducing dead space by effectively arranging driving circuits.

However, exemplary embodiments of the present inventive concepts are not restricted to those set forth herein. The above and other exemplary embodiments of the present inventive concepts will become more apparent to one of ordinary skill in the art to which the present disclosure pertains by referencing the detailed description of the present disclosure given below.

According to an exemplary embodiment of the present disclosure, a display device includes: a first area including a display area; a second area including a non-display area; a third area connecting the first and second areas; and a demultiplexing circuit unit disposed in the non-display area of the second area and overlapping with the first area in a direction of a thickness of the display device.

In an exemplary embodiment, the display device may further comprise signal wires disposed in the third area.

In an exemplary embodiment, the demultiplexing circuit unit may include a plurality of demultiplexers, and the demultiplexers may divide data signals and provide the divided data signals to the signal wires.

In an exemplary embodiment, the signal wires may include first and second signal wires, and the first and second signal wires may be disposed in different layers.

In an exemplary embodiment, the display device may further comprise a first conductive layer that includes gate electrodes, a second conductive layer that includes second electrodes of storage capacitors, a third conductive layer that includes first connecting electrodes, and a first electrode layer that includes anode electrodes. The anode electrodes are electrically connected to the first connecting electrodes.

In an exemplary embodiment, the display device may further comprise a third conductive layer that includes data lines, and a fourth conductive layer that includes connecting wires. The data lines and the connecting wires are electrically connected to each other.

In an exemplary embodiment, the display device may further comprise the third conductive layer that includes first power supply voltage lines. The connecting wires at least partially overlap with the first power supply voltage lines in the direction of the thickness of the display device. In an exemplary embodiment, the display device may further comprise a fourth conductive layer that includes a first power supply voltage lines, and a fifth conductive layer that includes connecting wires. The connecting wires at least partially overlap with the first power supply voltage lines.

In an exemplary embodiment, the display device further includes a plurality of insulating layers that separate the first, second, third, fourth, and fifth conductive layers from each other In an exemplary embodiment, the display device further comprises a third conductive layer that includes data lines. The data lines and the connecting wires are electrically connected to each other.

In an exemplary embodiment, the display device further comprises the fourth conductive layer that includes data lines. The data lines and the connecting wires are electrically connected to each other.

According to an exemplary embodiment of the present inventive concepts, a display device comprises a display panel including a bending area, a main area which is disposed on one side of the bending area, and a sub-area which extends from the other side of the bending area, and a demultiplexing circuit unit disposed in the sub-area.

In an exemplary embodiment, the demultiplexing circuit unit may include a plurality of demultiplexers. The demultiplexers divide data signals and provide the divided data signals to pixels via a plurality of signal wires. The signal wires are disposed in the bending area.

In an exemplary embodiment, the demultiplexing circuit unit may overlap with the main area.

In an exemplary embodiment, the display device may further comprise a driving chip disposed in the sub-area. The demultiplexing circuit unit is disposed between the bending area and the driving chip.

In an exemplary embodiment, the display panel may include a first conductive layer that includes gate electrodes, a second conductive layer that includes second electrodes of storage capacitors, a third conductive layer that includes first connecting electrodes, first electrodes that are electrically connected to the first connecting electrodes, a pixel-defining layer which includes openings that expose the first electrodes, and a light-emitting layer which is disposed in the openings of the pixel-defining layer.

In an exemplary embodiment, the display device may further comprise the third conductive layer that includes data lines, and a fourth conductive layer that includes connecting wires. The data lines and the connecting wires are electrically connected to each other.

In an exemplary embodiment, the main area may include a display area and a non-display area which accounts for the rest of the main area. The connecting wires may be in direct contact with the data lines via contact holes which penetrate an insulating film disposed between the fourth conductive layer and the third conductive layer, and the contact holes may be disposed in the non-display area of the main area.

In an exemplary embodiment, the display device may further comprise the first conductive layer that includes bending connecting wires, and the fourth conductive layer includes signal wires. First ends of the bending connecting wires are electrically connected to the signal wires, and second ends of the bending connecting wires are electrically connected to the connecting wires.

In an exemplary embodiment, the display device may further comprise the third conductive layer that includes contact wires. The signal wires and the bending connecting wires are electrically connected via the contact wires.

In another exemplary embodiment, a display device includes a display area that includes a main display area disposed on a first plane. A plurality of sub-display areas are connected to the main display area. The plurality of sub-display areas are not disposed on the first plane. A non-display area includes corner parts or round parts. The corner parts or round parts are disposed along outermost edges of each of the main display area and the plurality of sub-display areas. A bending area is connected to at least one of the sub-display areas. A sub-area is connected to the bending area. The sub-area includes a demultiplexing circuit disposed thereon. The de-multiplexing circuit overlaps with the main display area in a direction of a thickness of the display device.

According to the aforementioned and other exemplary embodiments of the present inventive concepts, since the demultiplexing circuit unit is arranged in an area at the rear of a bending area, the dead space of a display device can be reduced.

Other features and embodiments may be apparent from the following detailed description, the drawings, and the claims.

BRIEF DESCRIPTION OF THE DRAWINGS

The above and other embodiments and features of the present inventive concepts will become more apparent by describing in detail exemplary embodiments thereof with reference to the attached drawings, in which.

DETAILED DESCRIPTION OF THE EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided to convey the scope of the present inventive concepts to those skilled in the art.

It will also be understood that when a layer is referred to as being "on" another layer or substrate, it can be directly on the other layer or substrate, or intervening layers may also be present. The same reference numbers indicate the same components throughout the specification.

Exemplary embodiments of the present disclosure will hereinafter be described with reference to the accompanying drawings, taking an organic light-emitting diode (OLED) display device as an example.

Figure 1:
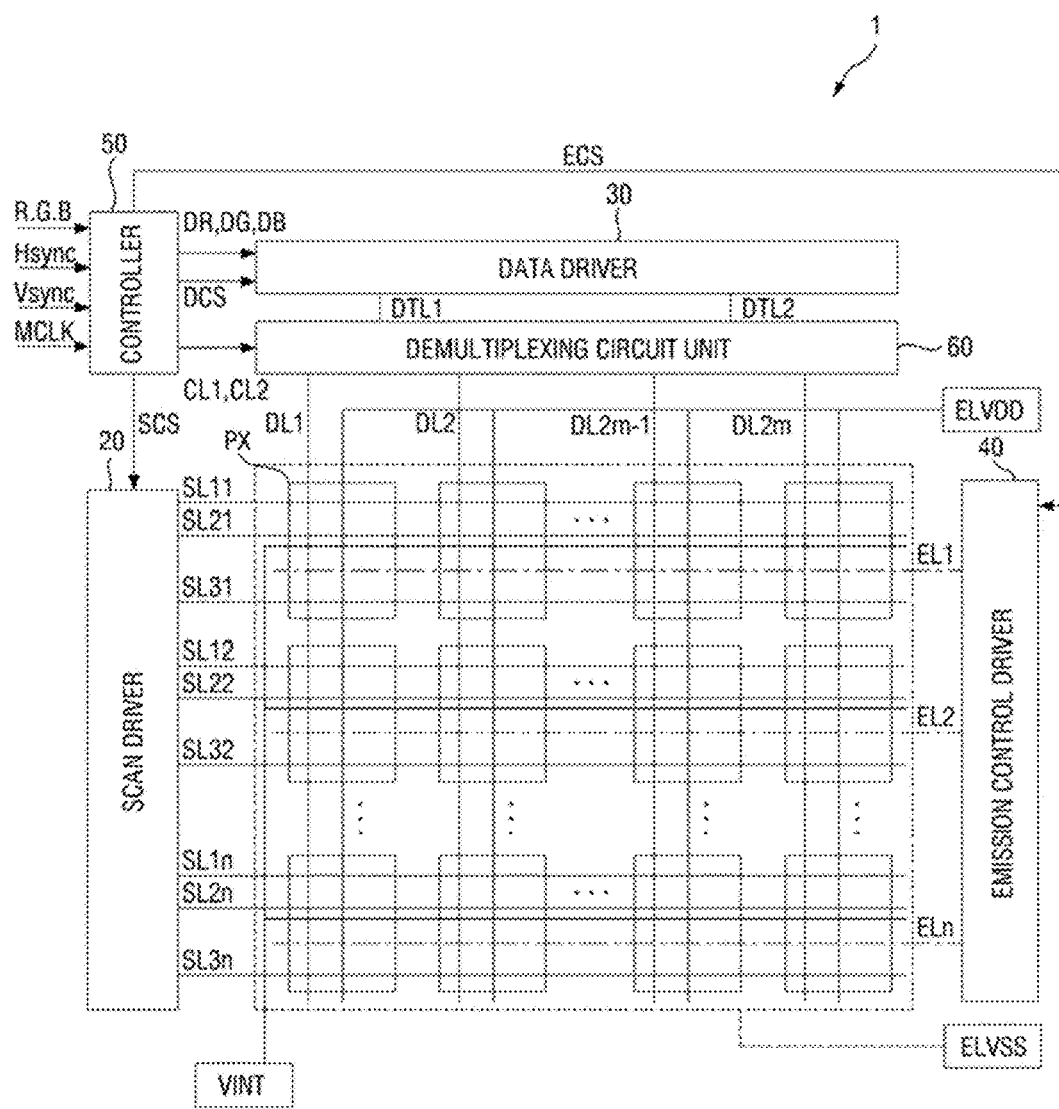
FIG. 1 is a block diagram of a display device according to an exemplary embodiment of the present inventive concepts.

FIG. 1 is a block diagram of a display device according to an exemplary embodiment of the present inventive concepts.

Referring to FIG. 1, a display device 1 includes a plurality of pixels PX, a scan driver 20, a data driver 30, a demultiplexing circuit unit 60, an emission control driver 40, and a controller 50.

The pixels PX are disposed at the intersections between a plurality of scan lines SL11 through SL1$n$, SL21 through SL2$n$, and SL31 through SL3$n$, a plurality of data lines DL1 through DL2$m$, and a plurality of emission control lines ELl through ELn and are arranged in a matrix. "m" and "n" are whole numbers.

As shown in the exemplary embodiment of FIG. 1, the scan lines SL11 through SL1$n$, SL21 through SL2$n$, and SL31 through SL3$n$ and the emission control lines EL through ELn may extend in a row direction, and the data lines DL1 through DL2m may extend in a column direction. However, in other exemplary embodiments, the scan lines SL11 through SL1n, SL21 through SL2n, and SL31 through SL3n and the emission control lines EL through ELn may extend in the column direction, and the data lines DL1 through DL2m may extend in the row direction.

As shown in the exemplary embodiment of FIG. 1, a line for supplying an initialization voltage VINT may branch into multiple initialization voltage lines extending in the row direction. A line for supplying a first power supply voltage ELVDD may branch into first power supply voltage lines extending in the column direction. However, exemplary embodiments of the present inventive concepts are not limited to thereto, and the directions in which the initialization voltage lines and the first power supply voltage lines extend may vary.

In an exemplary embodiment, three scan lines, one data line, one emission control line, one initialization voltage line, and one first power supply voltage line may pass through each of the pixels PX.

The scan driver 20 may generate three scan signals for each of the pixels PX and may transmit the three scan signals to each of the pixels PX via the scan lines SL11 through SL1n, SL21 through SL2n, and SL31 through SL3n. For example, the scan driver 20 may sequentially supply scan signals to first scan lines SL11 through SL1n, second scan lines SL21 through SL2n, and third scan lines SL31 through SL3n.

The data driver 30 outputs data signals. The data signals that are output by the data driver 30 are transmitted to the demultiplexing circuit unit 60 via data transmission lines (DTLs). For example, in the exemplary embodiment shown in FIG. 1, data transmission lines DTL1, DTL2 transmit the output data signals from the data driver 30 to the demultiplexing circuit unit 60. The demultiplexing circuit unit 60 includes a plurality of demultiplexers DEMUX. The demultiplexers DEMUX demultiplex the output data signals and provide the demultiplexed data signals to the data lines (DL1 through DL2m). For example, if the data signals that are output by the data driver 30 include first and second data signals, the demultiplexers DEMUX may sequentially provide the first and second data signals to first and second data lines DL1 and DL2, respectively. The demultiplexers DEMUX will hereinafter be described in detail with reference to FIG. 2.

Figure 2:
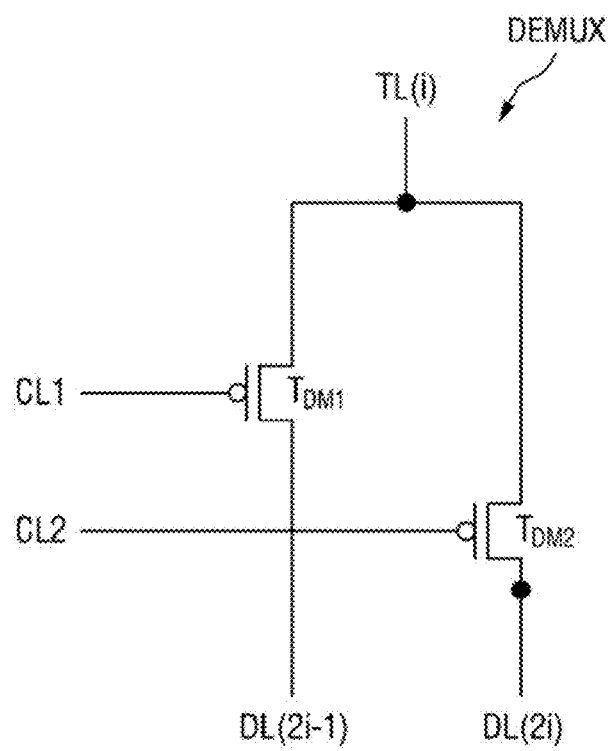
FIG. 2 is a circuit diagram of a demultiplexer included in a demultiplexing circuit unit of the display device of FIG. 1 according to an exemplary embodiment of the present inventive concepts.

FIG. 2 is a circuit diagram of a demultiplexer included in the demultiplexing circuit unit of the display device of FIG. 1.

Referring to FIG. 2, a demultiplexer DEMUX includes first and second demultiplexer transistors $T_{DM1}$ and $T_{DM2}$. In the exemplary embodiment shown in FIG. 2, the first and second demultiplexer transistors $T_{DM1}$ and $T_{DM2}$ are illustrated as being P-type metal oxide semiconductor (PMOS) transistors. However, exemplary embodiments of the present inventive concepts are not limited thereto. For example, the first and second demultiplexer transistors $T_{DM1}$ and $T_{DM2}$ may be N-type metal oxide semiconductor (NMOS) transistors in other exemplary embodiments.

The first demultiplexer transistor $T_{DM1}$ is connected between a DTL TL(i) and a first data line DL(2i−1) and includes a gate electrode that is connected to a first demultiplexer selection signal CL1. In response to a low-level first demultiplexer selection signal CL1 being applied to the gate electrode of the first demultiplexer transistor $T_{DM1}$, the first demultiplexer transistor $T_{DM1}$ may be turned on so that a data signal applied to the DTL TL(i) may be output to the first data line DL(2i−1).

The second demultiplexer transistor $T_{DM2}$ is connected between the DTL TL(i) and a second data line DL(2i) and includes a gate electrode connected to a second demultiplexer selection signal CL2. In response to a low-level second demultiplexer selection signal CL2 being applied to the gate electrode of the second demultiplexer transistor $T_{DM2}$, the second demultiplexer transistor $T_{DM2}$ may be turned on so that the data signal applied to the DL TL(i) may be output to the second data line DL(2i).

In response to the first and second demultiplexer transistors $T_{DM1}$ and $T_{DM2}$ being selectively turned on by the first and second demultiplexer selection signals CL1 and CL2, the data signal applied to the DTL TL(i) may be sequentially provided, through time division, to the first and second data lines DL(2i−1) and DL(2i).

While the demultiplexer DEMUX in the exemplary embodiment shown in FIG. 2 divides a single data signal output from the data driver 30 between two data lines, in other exemplary embodiments, the demultiplexer DEMUX may divide a single data signal between three or more data lines.

Referring again to FIG. 1, data signals output by the demultiplexing circuit unit 60 are transmitted to the pixels PX via the data lines DL1 through DL2m. The data signals are provided to pixels selected by first scan signals whenever the first scan signals are provided to the first scan lines SL11 through SL1n.

The emission control driver 40 generates emission control signals and transmits the emission control signals to the pixels PX via the emission control lines ELI through ELn. The emission control signals control the emission times of the pixels PX However, in certain exemplary embodiments, the emission control driver 40 may be incorporated into the scan driver 20 and the scan driver 20 generates both the emission control signals and the scan signals. Additionally, the emission control driver 40 may not be provided depending on the internal structure of the pixels PX.

The controller 50 converts a plurality of image signals R, G, and B provided thereto into a plurality of image data signals DR, DG, and DB and transmits the image data signals to the data driver 30. The controller 50 also receives a vertical synchronization signal Vsync, a horizontal synchronization signal Hsync, and a clock signal MCLK. The controller 50 generates control signals for driving the scan driver 20, the data driver 30, and the emission control driver 40, and transmits the control signals to the scan driver, the data driver, and the emission control driver. For example, the controller 50 may generate a scan driving control signal SCS for controlling the scan driver 20, a data driving control signal DCS for controlling the data driver 30, and an emission driving control signal ECS for controlling the emission control driver 40. The controller 50 and transmits the scan driving control signal SCS, the data driving control signal DCS, and the emission driving control signal ECS to the scan driver 20, the data driver 30, and the emission driving controller 40, respectively. The controller 50 also generates the first and second demultiplexer selection signals CL1 and CL2 for controlling the demultiplexers DEMUX and transmits the first and second demultiplexer selection signals CL1 and CL2 to the demultiplexing circuit unit 60.

Each of the pixels PX is provided with first and second power supply voltages ELVDD and ELVSS. The first power supply voltage ELVDD may be a predetermined high-level voltage, and the second power supply voltage ELVSS may be a voltage that is lower than the first power supply voltage ELVDD.

In response to a driving current Ioled being provided to light-emitting elements of the pixels, the pixels PX emit light of a predetermined luminance in accordance with data signals provided thereto via the data lines DL1 through DL2m. The first power supply voltage ELVDD, the second power supply voltage ELVSS, and the initialization voltage VINT may be provided by an external power source.

The pixels PX are arranged in a matrix. The pixels PX may include first-color pixels, second-color pixels, and third-color pixels. In an exemplary embodiment, the first-color pixels may be red pixels, the second-color pixels may be green pixels, and the third-color pixels may be blue pixels. In an exemplary embodiment, the pixels PX may be arranged in a stripe fashion such that pixels PX of the same color may be arranged in a first direction DR1, which is the column direction, and the red pixels, green pixels, and blue pixels may be alternately arranged in a second direction DR2, which is the row direction. However, exemplary embodiments of the present inventive concepts are not limited thereto. For example, in another exemplary embodiment, the pixels PX may be formed as rhombuses and may be arranged in a pentile fashion so that red pixels and blue pixels may be arranged radially with respect to green pixels. The pixels PX may further include white pixels in addition to red pixels, green pixels, and blue pixels.

Figure 3:
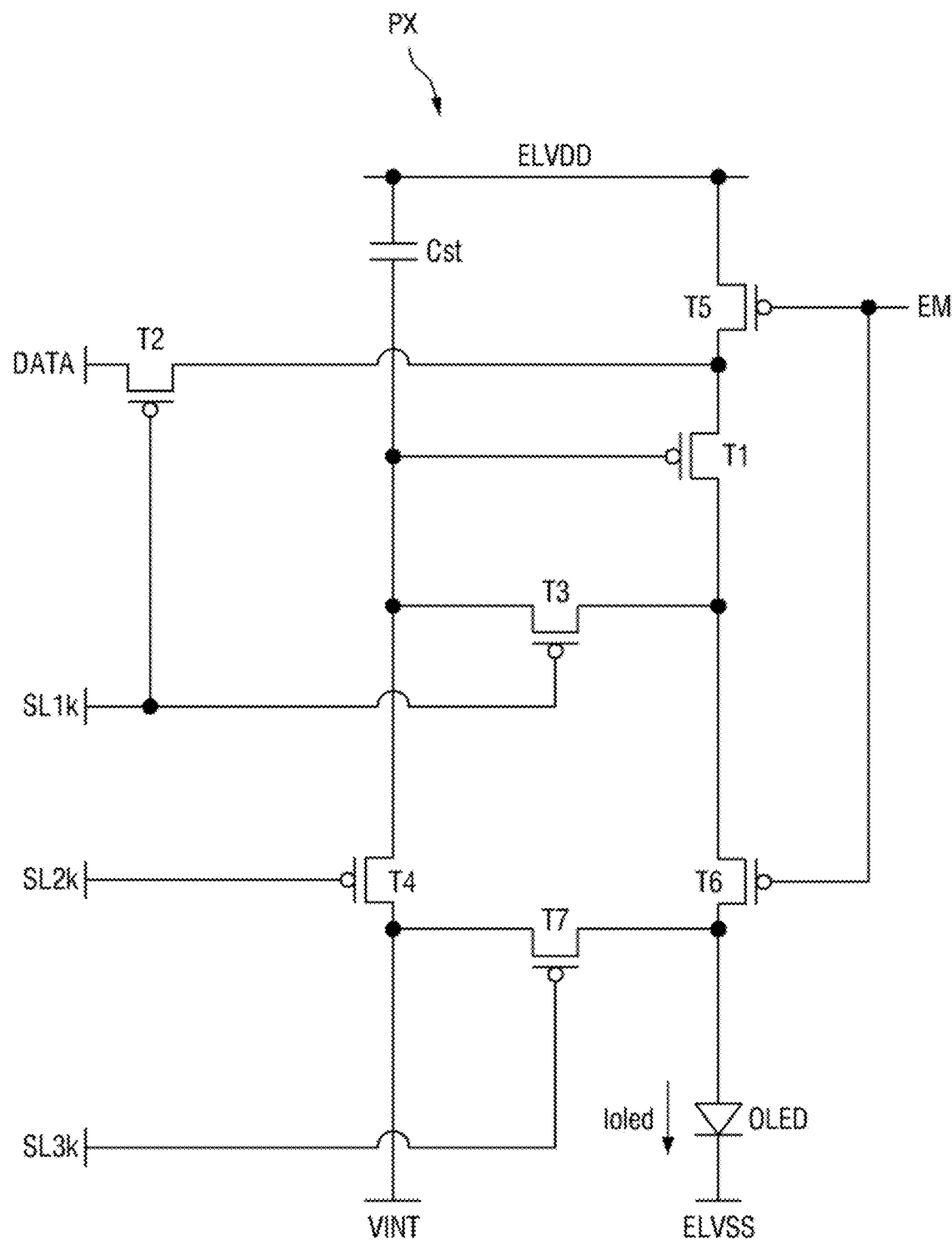
FIG. 3 is an equivalent circuit diagram of a pixel of the display device of FIG. 1 according to an exemplary embodiment of the present inventive concepts.

FIG. 3 is an equivalent circuit diagram of a pixel of the display device of FIG. 1.

Referring to FIG. 3, a pixel PX may include an OLED "OLED", a plurality of transistors T1 through T7, and a storage capacitor Cst. A data signal DATA, a first scan signal SL1k, a second scan signal SL2k, a third scan signal SL3k, an emission control signal EM, the first power supply voltage ELVDD, the second power supply voltage ELVSS, and the initialization voltage VINT are applied to the pixel PX.

The OLED "OLED" includes an anode electrode and a cathode electrode. The storage capacitor Cst includes first and second electrodes.

The transistors include first through seventh transistors T1 through T7. Each of the transistors T1 through T7 includes a gate electrode and first and second electrodes. One of the first and second electrodes of each of the transistors T1 through T) may be a source electrode and the other electrode of the first and second electrodes may be a drain electrode.

The transistors T1 through T7 may be thin-film transistors (TFTs). Each of the transistors T1 through T7 may be one of PMOS and NMOS transistors. The transistors T1 through T7 are illustrated as being PMOS transistors. However, exemplary embodiments of the present inventive concepts are not limited thereto and at least some of the transistors may be NMOS transistors as well. For example, in an exemplary embodiment, the first, second, fifth, and sixth transistors T1, T2, T5, and T6, which are a driving transistor, a data transmission transistor, a first emission control transistor, and a second emission control transistor, respectively, may be PMOS transistors, and the third, fourth, and seventh transistors T3, T4, and T7, which are a compensation transistor, a first initialization transistor, and a second initialization transistor, respectively, may be NMOS transistors.

The gate electrode of the first transistor T1 is connected to the first electrode of the storage capacitor Cst. The first electrode of the first transistor T1 is connected to the first power supply voltage ELVDD via the fifth transistor T5. The second electrode of the first transistor T1 is connected to the anode electrode of the OLED "OLED" via the sixth transistor T6. The first transistor T1 receives the data signal DATA in accordance with a switching operation performed by the second transistor T2 and applies a driving current Ioled to the OLED "OLED".

The gate electrode of the second transistor T2 is connected to the first scan signal SL1k. The first electrode of the second transistor T2 is connected to the data signal DATA. The second electrode of the second transistor T2 is connected to the first electrode of the first transistor T1 and is connected to the first power supply voltage ELVDD via the fifth transistor T5. The second transistor T2 is turned on by the first scan signal SL1k and performs a switching operation to transmit the data signal DATA to the first electrode of the first transistor T1.

The gate electrode of the third transistor T3 is connected to the first scan signal SL1k. The first electrode of the third transistor T3 is connected to the second electrode of the first transistor T1 and is connected to the anode electrode of the OLED "OLED" via the sixth transistor T6. The second electrode of the third transistor T3 is connected to the first electrode of the storage capacitor Cst, the first electrode of the fourth transistor T4, and the gate electrode of the first transistor T1. The third transistor T3 is turned on by the first scan signal SL1k to connect the gate electrode and the second electrode of the first transistor T1 and thus to diode-connect the first transistor T1. As a result, a voltage difference as much as the threshold voltage of the first transistor T1 is generated between the first electrode and the gate electrode of the first transistor T1, and threshold voltage deviations in the first transistor T1 can be offset by providing the gate electrode of the first transistor T1 with a data signal DATA compensated for by as much as the threshold voltage of the first transistor T1.

The gate electrode of the fourth transistor T4 is connected to the second scan signal SL2k. The second electrode of the fourth transistor T4 is connected to the initialization voltage VINT. The first electrode of the fourth transistor T4 is connected to the first electrode of the storage capacitor Cst, the second electrode of the third transistor T3, and the gate electrode of the first transistor T1. The fourth transistor T4 is turned on by the second scan signal SL2k to transmit the initialization voltage VINT to the gate electrode of the first transistor T1 and thus to initialize the voltage at the gate electrode of the first transistor T1.

The gate electrode of the fifth transistor T5 is connected to the emission control signal EM. The first electrode of the fifth transistor T5 is connected to the first power supply voltage ELVDD. The second electrode of the fifth transistor T5 is connected to the first electrode of the first transistor T1 and the second electrode of the second transistor T2.

The gate electrode of the sixth transistor T6 is connected to the emission control signal EM. The first electrode of the sixth transistor T6 is connected to the second electrode of the first transistor T1 and the first electrode of the third transistor T3. The second electrode of the sixth transistor T6 is connected to the anode electrode of the OLED "OLED".

The fifth and sixth transistors T5 and T6 are turned on at the same time by the emission control signal EM, and as a result, the driving current Ioled flows to the OLED "OLED".

The gate electrode of the seventh transistor T7 is connected to the third scan signal SL3k. The first electrode of the seventh transistor T7 is connected to the anode electrode of the OLED "OLED". The second electrode of the seventh transistor T7 is connected to the initialization voltage VINT.

The seventh transistor T7 is turned on by the third scan signal SL3k to initialize the anode electrode of the OLED "OLED".

The second electrode of the storage capacitor Cst is connected to the first power supply voltage ELVDD. The first electrode of the storage capacitor Cst is connected to the gate electrode of the first transistor T1, the second electrode of the third transistor T3, and the first electrode of the fourth transistor T4. The cathode electrode of the OLED "OLED" is connected to the second power supply voltage ELVSS. The OLED "OLED" receives the driving current Ioled from the first transistor T1 and thus emits light to display an image.

The structure of the display device 1 will hereinafter be described in further detail.

Figure 4:
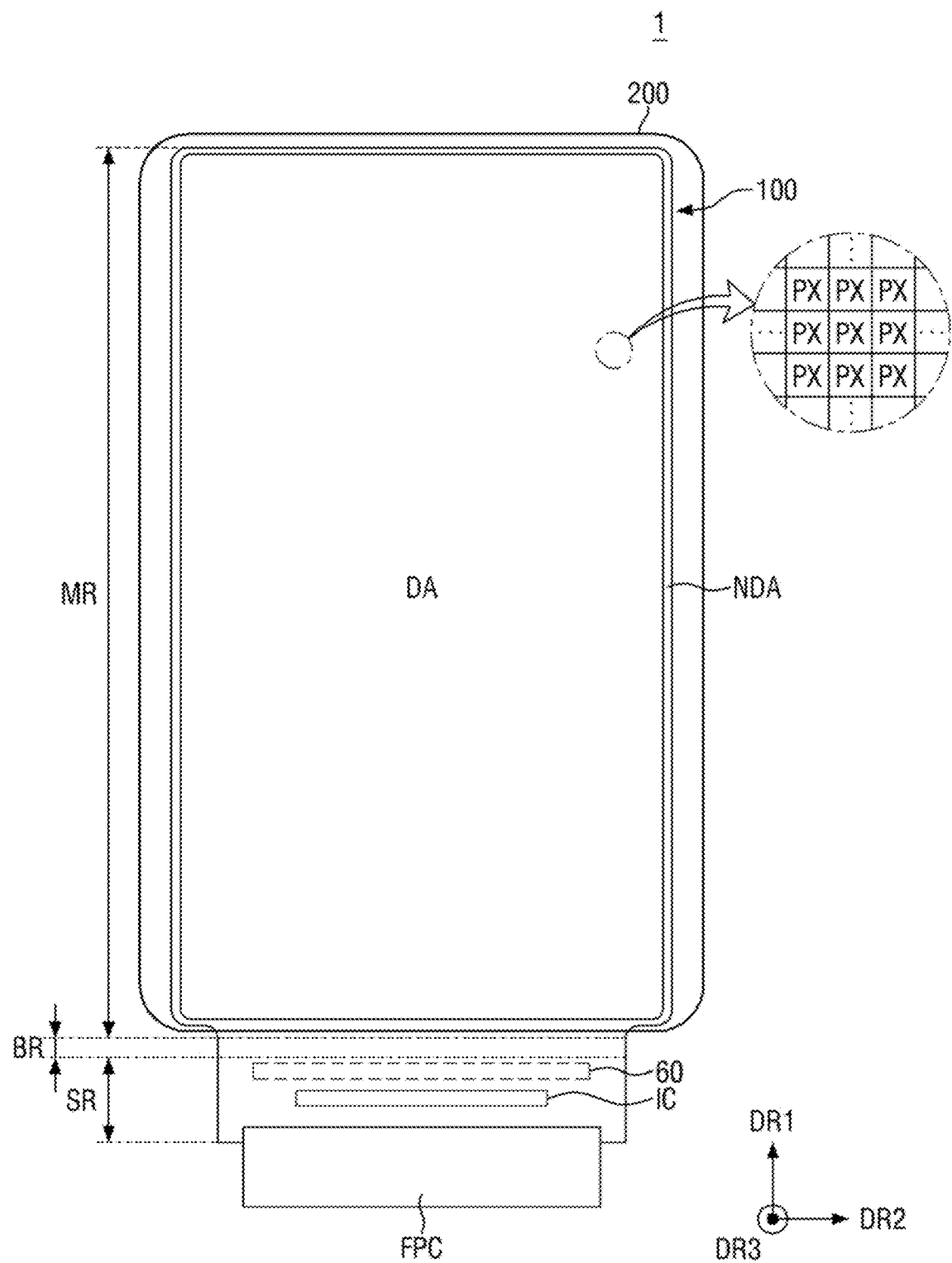
FIG. 4 is a plan view of the display device of FIG. 1 according to an exemplary embodiment of the present inventive concepts.
Figure 5:
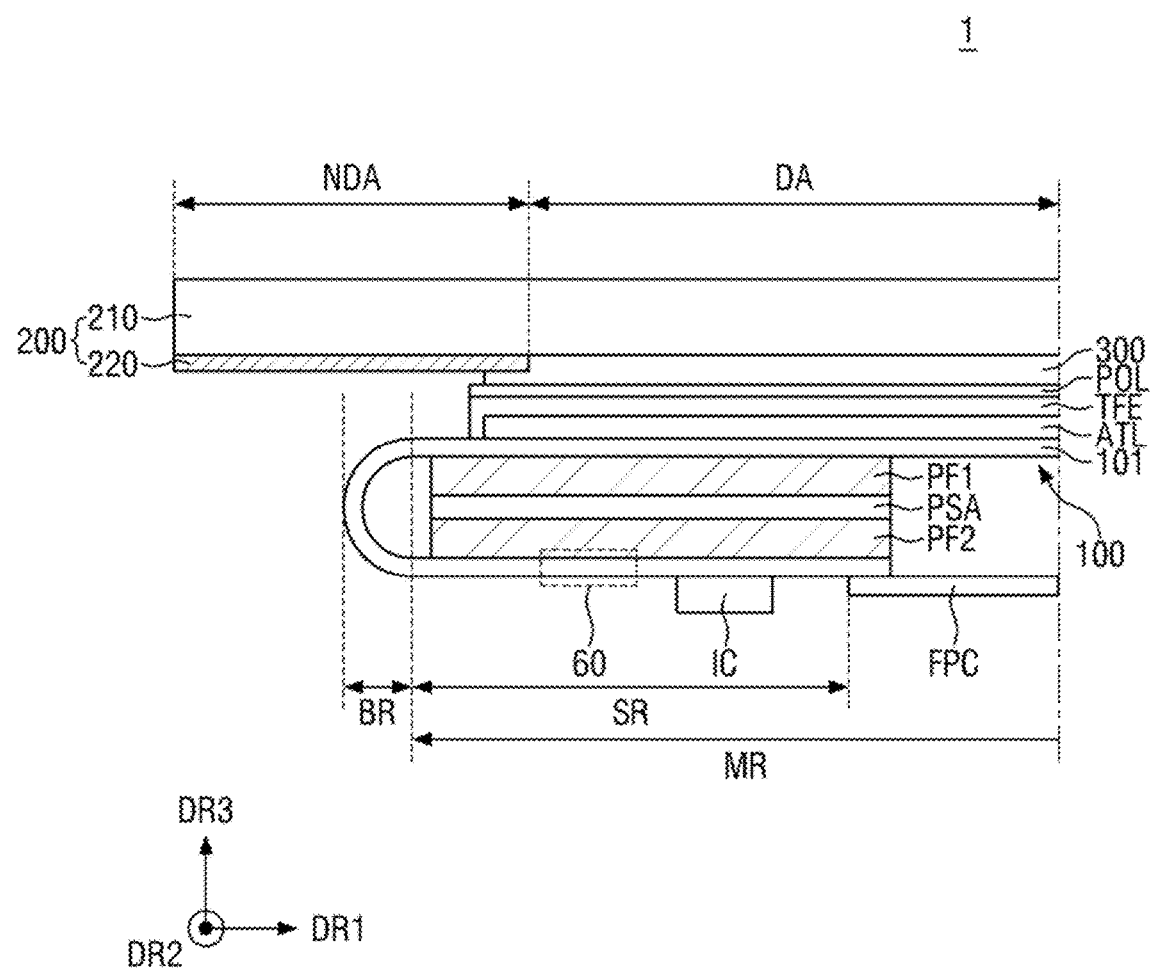
FIG. 5 is a partial cross-sectional view of the display device of FIG. 1 according to an exemplary embodiment of the present inventive concepts.

FIG. 4 is a plan view of the display device of FIG. 1. FIG. 5 is a partial cross-sectional view of the display device of FIG. 1.

Referring to FIGS. 4 and 5, the display device 1 displays at least one of a moving image and a still image. The display direction of the main screen of the display device 1 may extend towards the front of the display screen in the third direction DR3 which is perpendicular to the first direction DR1 and second direction DR2. This display device 1 is a front emission display device. However, in other exemplary embodiments, the display direction of the main screen of the display device 1 may be in the opposite direction of the third direction DR3 towards the rear of the display screen and the display device 1 is a rear emission display device. In other exemplary embodiments, the display device 1 may be a double-sided display device or a transparent display device in which the images are displayed both towards the front of the display screen in the third direction DR3 and towards the rear of the display screen in the opposite direction of the third direction DR3.

The display device 1 includes a display area DA in which an image is displayed and a non-display area NDA which does not display an image. In an exemplary embodiment, the display area DA may have a rectangular shape or a rectangular shape with rounded corners. For example, the display area DA may have a rectangular shape that has rounded corners and extends longer in the first direction DR1 than in the second direction DR2. However, exemplary embodiments of the present inventive concepts are not limited thereto. For example, the display area DA may have various other shapes such as a rectangular shape extending longer in the second direction DR2 than in the first direction DR1, another polygonal shape, a circular shape, an elliptical shape, etc.

The non-display area NDA is disposed on the periphery of the display area DA. The non-display area NDA may be a bezel area. The non-display area NDA may overlap with a printed layer 220 of a window member 200 that will be described later.

In an exemplary embodiment, the non-display area NDA may surround all four sides of the display area DA. However, exemplary embodiments of the present inventive concepts are not limited thereto. Alternatively, the non-display area NDA may not be disposed near an upper side of the display area DA.

In the non-display area NDA, signal wires and driving circuits for applying signals to the display area DA may be disposed. The non-display area NDA may not include a display area.

The display device 1 includes a display panel 100 which provides a display screen. Examples of the display panel 100 include an OLED display panel, a micro light-emitting diode (mLED) display panel, a nano light-emitting diode (nanoLED) display panel, a quantum dot light-emitting diode (QLED) display panel, a liquid crystal display (LCD) panel, a plasma display panel (PDP), a field emission display (FED) panel, an electrophoretic display (EPD) panel, and an electrowetting display panel. In the description that follows, it is assumed that an OLED display panel is used as the display panel 100. However, exemplary embodiments of the present inventive concepts are not limited thereto. For example, various display panels other than an OLED display panel may be used as the display panel 100.

The display panel 100 may include a plurality of pixels PX. The pixels PX may be arranged in row and column directions. The pixels PX may have a rectangular or square shape in a plan view. However, exemplary embodiments of the present inventive concepts are not limited thereto. For example, the pixels PX may have a rhombic shape whose sides are inclined with respect to the first direction DR1. The pixels PX may include emission areas. The emission areas may have the same shape or a different shape than the shape of the pixels PX.

The display device 1 may further include a touch member which detects touch input. The touch member may be incorporated into the display panel 100. In an exemplary embodiment where the touch member is incorporated into the display panel 100, the electrodes or wires of the display panel 100 may be used as touch electrodes or touch sensing wires.

The display panel 100 may include a flexible substrate 101 which includes a flexible polymer material such as polyimide. Accordingly, the display panel 100 may be bendable, foldable, or rollable.

The display panel 100 may include a first area which includes the display area DA, a second area which includes the non-display area NDA, and a third area which connects the first and second areas. The third area may be a bending area BR, the first area may be a main area MR which is disposed on a first side of the bending area BR, and the second area may be a sub-area SR which is disposed on a second side of the bending area BR. For example, as shown in the exemplary embodiment of FIG. 4, the sub-area SR may be spaced apart from the display area DA in the first direction DR1 with the bending region BR disposed therebetween.

The display area DA of the display panel 100 is disposed in the main area MR. In an exemplary embodiment, peripheral portions surrounding the display area DA, the entire bending area BR, and the entire sub-area SR may be classified as the non-display area NDA. However, exemplary embodiments of the present inventive concepts are not limited thereto. For example, in another exemplary embodiment, the bending area BR and/or the sub-area SR may also include the display area DA.

As shown in the exemplary embodiment of FIG. 5, in the main area MR, an active element layer ATL and a thin-film encapsulation layer TFE may be disposed. The active element layer ATL may include light-emitting elements and touch electrodes, and will be described later in detail. The thin-film encapsulation layer TFE covers the active element layer ATL to prevent the active element layer ATL from being exposed to moisture or air. For example, as shown in FIG. 5, the thin-film encapsulation layer TFE may cover a top surface of the active element layer ATL in the third direction DR3 and at least one side surface of the thin-film encapsulation layer in the first direction DR1.

The display panel 100 may further include a polarizing member POL. In an exemplary embodiment, the polarizing member POL may be provided in the form of a polarizing film or a polarizing layer. The polarizing member POL may be attached on the thin-film encapsulation layer TFE. For example, as shown in FIG. 5, the polarizing member may be attached to a top surface of the thin-film encapsulation layer TFE in the third direction DR3. The polarizing member POL may be disposed in the main area MR. In certain exemplary embodiments, the polarizing member POL may also be disposed in the sub-area SR. In other exemplary embodiments, the polarizing member POL may not be provided.

The bending area BR may be connected to a second side of the main area MR in the first direction DR1. For example, the bending area BR may be connected to a lower short side of the main area MR. In an exemplary embodiment, the width of the bending area BR (e.g., the length in the second direction DR2) may be smaller than the width of the main area MR (e.g., the length of the short sides of the main area MR in the second direction).

In the bending area BR, the display panel 100 may be bent to have curvature in the opposite direction of the third direction DR3. In an exemplary embodiment, the bending area BR may have a predetermined curvature radius. However, exemplary embodiments of the present inventive concepts are not limited thereto. Alternatively, the bending area BR may have different curvature radiuses in different parts thereof. In response to the display panel 100 being bent in the bending area BR, the surfaces of the display panel 100 may be reversed. For example, as shown in FIG. 5, a first surface of the display panel 100 that originally faces upwards towards the front of the display screen may be turned outside and may then be turned downwards to face the rear of the display device through the bending area BR.

The sub-area SR extends from the bending area BR. In an exemplary embodiment, the sub-area SR may extend from where bending is complete in a direction parallel to the main area MR (e.g., in the first direction DR1 and second direction DR2). The sub-area SR and the main area MR may overlap in the third direction DR3, e.g., in the direction of the thickness of the display panel 100. The width of the sub-area SR (e.g., the length in the second direction DR2) may be the same as the width of the bending area BR (e.g., the length in the second direction DR2). However, exemplary embodiments of the present inventive concepts are not limited thereto.

A driving chip IC may be disposed in the sub-area SR. The driving chip IC may include an integrated circuit for driving the display panel 100. The integrated circuit may include a data driver 30 which generates and provides data signals. In an exemplary embodiment, the data driver 30 may be mounted in the form of an integrated circuit in the sub-area SR. The driving chip IC may be mounted on the first surface of the display panel 100, which is a display surface. As the bending area BR is bent, the first surface of the display panel 100 may be turned toward the opposite direction of the third direction DR3 and the top surface of the driving chip IC may face downwards.

The driving chip IC may be attached to the display panel 100 via an anisotropic conductive film or through ultrasonic bonding. The width of the driving chip IC (e.g., the length of the driving chip in the second direction DR2) may be smaller than the width of the display panel 100 (e.g., the length of the display panel in the second direction DR2). The driving chip IC may be disposed approximately in the middle of the sub-area SR in the second direction DR2 and the left and right edges of the driving chip IC may be spaced apart from the left and right edges of the sub-area SR in the second direction.

The demultiplexing circuit unit 60 may be disposed in the sub-area SR. When the display panel 100 is bent, the sub-area SR overlaps with the main area MR and is not visible from the front of the display panel 100. Therefore, by arranging the demultiplexing circuit unit 60 in the sub-area SR, the demultiplexing circuit unit is not disposed on a front surface of the display panel and dead space located on the front of the display panel 100 is reduced.

In the sub-area SR, the demultiplexing circuit unit 60 may be disposed between the bending area BR and the driving chip IC. For example as shown in FIG. 5, the driving chip IC, the demultiplexing circuit unit 60 and an end of the bending region BR adjacent to the sub-area SR are spaced apart in the first direction DR1. The demultiplexing circuit unit 60 and the display area DA may overlap in the third direction DR3 (e.g., in the direction of the thickness of the display panel 100). The demultiplexing circuit unit 60 and the main area MR of the display panel 100 may also overlap in the third direction DR3.

FIG. 5 illustrates that the demultiplexing circuit unit 60 overlaps with the display area DA. However, exemplary embodiments of the present inventive concepts are not limited thereto. In certain exemplary embodiments, the demultiplexing circuit unit 60 may also partially overlap with the non-display area NDA.

The demultiplexing circuit unit 60 and the scan driver 20 include a plurality of transistors and wires, and these transistors and wires may be formed at the same time as the transistors, the wires, and the electrodes of the pixels PX.

A pad unit may be disposed at an end of the sub-area SR. The pad unit may include display signal wire pads and touch signal wire pads. A driving substrate FPC may be connected to the pad unit at the end of the sub-area SR. In an exemplary embodiment, the driving substrate FPC may be a flexible printed circuit board (FPCB) or a film.

The display panel 100 may further include first and second protective films PF1 and PF2 which are disposed in the overlapping area of the main area MR and the sub-area SR when the bending area BR is bent. For example, the first protective film PF1 may be attached to a rear surface of the substrate 101 in the main area MR, and the second protective film PF2 may be attached to a rear surface of the substrate 101 in the sub-area SR which faces towards the front of the display device when the bending area BR is bent. The first and second protective films PF1 and PF2 may face each other and may be coupled to each other via an adhesive such as a pressure sensitive adhesive (PSA). Accordingly, the mechanical stability of the bending structure of the display device 1 can be improved. However, in another exemplary embodiment, the display panel 100 may include a single protective film disposed in the overlapping area of the main area MR and the sub-area SR when the bending area BR is bent.

The display device 1 may further include the window member 200. The window member 200 covers and protects the display panel 100.

The window member 200 may include a window base 210 and the printed layer 220, which is disposed on the window base.

The window base 210 may be formed of a transparent material. For example, the window base 210 may include, for example, glass or plastic. However, exemplary embodiments of the present inventive concepts are not limited thereto. In an embodiment in which the window base 210 includes plastic, the window base 210 may have flexibility.

The planar shape of the window base 210 corresponds to the planar shape of the display device 1. For example, in an embodiment in which the display device 1 has a substantially rectangular shape in a plan view, the window base 210 may also have a substantially rectangular shape in a plan view. In another exemplary embodiment in which the display device 1 has a circular shape, the window base 210 may also have a circular shape.

The window base 210 may be larger in size than the display panel 100 in a plan view. For example, the sides of the window base 210 may protrude beyond the sides of the display panel 100 in the first direction DR1 and/or the second direction DR2. The window base 210 may protrude outwardly beyond all the four sides of the display panel 100.

The printed layer 220 may be disposed on the window base 210. The printed layer 220 may be disposed on a first surface and/or a second surface of the window base 210. For example, as shown in FIG. 5, the printed layer 220 may be disposed on a bottom surface of the window base 210 in the third direction DR3. However, in other exemplary embodiments, the printed layer 220 may be disposed on a top surface of the window base 210 in the third direction DR3. The printed layer 220 may be disposed on edge parts of the window base 210 and may be arranged in the non-display area NDA. In an exemplary embodiment, the printed layer 220 may be an outermost black matrix layer and/or a decorative layer providing an aesthetic aspect.

An adhesive layer 300 may be disposed between the window member 200 and the display panel 100. The window member 200 may be coupled to the display panel 100 via the adhesive layer 300. The adhesive layer 300 may include any type of material suitable for coupling the window member 200 and the display panel 100 together. For example, the adhesive layer 300 may include an optically clear adhesive (OCA).

The structure of the pixels PX of the display device 1 will hereinafter be described.

Figure 6:
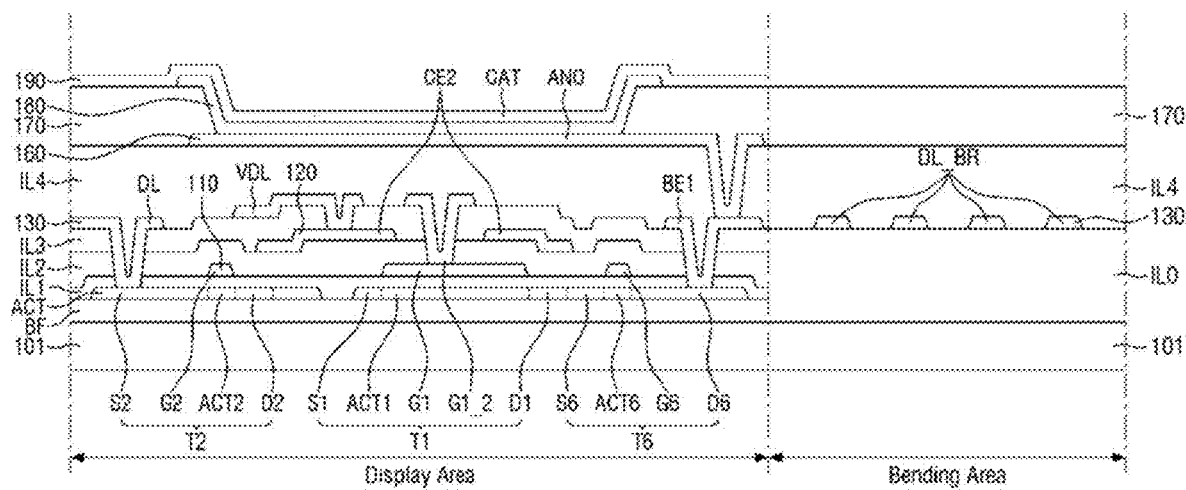
FIG. 6 is a cross-sectional view illustrating a pixel and a bending area of the display device of FIG. 1 according to an exemplary embodiment of the present inventive concepts.

FIG. 6 is a cross-sectional view illustrating a pixel and a bending area of the display device of FIG. 1. FIGS. 7 through 10 are cross-sectional views illustrating bending areas of display devices according to other embodiments of the present disclosure.

Some of the elements described above with reference to FIGS. 1 through 5 are referred to by different reference numerals in FIG. 6 than in FIGS. 1 through 5 to clarify the interlayer configuration of the display device 1.

Referring to FIG. 6, a pixel PX may include a substrate 101, a buffer layer BF, a semiconductor layer ACT, a first insulating layer IL1, a first conductive layer 110, a second insulating layer IL2, a second conductive layer 120, a third insulating layer IL3, a bending insulating layer IL0, a third conductive layer 130, a fourth insulating layer IL4, a first electrode layer 160, and a pixel-defining layer 170 which includes an opening that exposes the first electrode layer 160, an organic layer 180 which is disposed in the opening of the pixel-defining to layer 170, and a second electrode layer 190 which is disposed on the organic layer 180 and the pixel-defining layer 170.

The layers that form the pixel PX may be single-layer films or stacks of multiple films, and may have intervening layers interposed therebetween.

The substrate 101 supports the layers disposed thereabove. In an exemplary embodiment, the substrate 101 may be formed of an insulating material such as a polymer resin. Examples of the polymer resin include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and a combination thereof. The substrate 101 may be a flexible substrate that is bendable, foldable, or rollable. The flexible substrate may be formed of PI. However, exemplary embodiments of the present inventive concepts are not limited thereto. For example, in an alternative embodiment, the substrate 101 may be a rigid substrate formed of glass or quartz.

The buffer layer BF is disposed on the substrate 101. For example, as shown in FIG. 6, the buffer layer BF is disposed on a top surface of the substrate 101 in the third direction DR3. The buffer layer BF may prevent the diffusion of impurity ions and the penetration of moisture or external air and may perform a surface planarization function. The buffer layer BF may include silicon nitride, silicon oxide, or silicon oxynitride.

The semiconductor layer ACT is disposed on the buffer layer BF. For example, as shown in FIG. 6, the semiconductor layer ACT is disposed on a top surface of the buffer layer BF in the third direction DR3. The semiconductor layer ACT forms a channel with first through seventh transistors T1 through T7 of the pixel PX and first and second demultiplexer transistors $T_{DM1}$ and $T_{DM2}$ of a demultiplexer DEMUX. The semiconductor layer ACT may include polycrystalline silicon which is obtained by crystallizing amorphous silicon.

In an embodiment in which the semiconductor layer ACT is formed of polycrystalline silicon and is doped with ions, the semiconductor layer ACT may have conductivity. Accordingly, the semiconductor layer ACT may include first through seventh channel regions ACT1 through ACT7 of the first through seventh transistors T1 through T7, source electrodes of the first through seventh transistors and drain electrodes of the first through seventh transistors. The semiconductor layer ACT may include the first through seventh channel regions ACT1 through ACT7 of the first through seventh transistors T1 through T7 and first through seventh source regions S1 through S7 and first through seventh drain regions D1 through D7 of the first through seventh transistors, and the first through seventh source regions Si through S7 and the first through seventh drain regions D1 through D7 are disposed on both sides of the respective channel region.

The first through seventh source regions S1 through S7 and the first through seventh drain regions D1 through D7 are connected to both sides of the respective channel region in a plan view.

Alternatively, the semiconductor layer ACT may include monocrystalline silicon, low-temperature polycrystalline silicon, amorphous silicon, or an oxide semiconductor. The oxide semiconductor may include, for example, a binary compound (ABx), a ternary compound (ABxCy), or a quaternary compound (ABxCyDz) containing indium (In), zinc (Zn), gallium (Ga), tin (Sn), titanium (Ti), aluminum (A), hafnium (Hf), zirconium (Zr), or magnesium (Mg). In an exemplary embodiment, the semiconductor layer ACT may comprise indium tin zinc oxide (ITZO) or indium gallium zinc oxide (IGZO). However, exemplary embodiments of the present inventive concepts are not limited thereto.

The first insulating layer IL may be a gate insulating film having a gate insulating function. The first insulating layer IL1 may include a silicon compound or a metal oxide. For example, the first insulating layer IL1 may include silicon oxide, silicon nitride, silicon oxynitride, aluminum oxide, tantalum oxide, hafnium oxide, zirconium oxide, or titanium oxide. However, exemplary embodiments of the present inventive concepts are not limited thereto. The first insulating layer IL1 may be a single-layer film or a multilayer film consisting of a stack of different materials.

The first insulating layer IL1 may be disposed on the semiconductor layer ACT. For example, the first insulating layer IL1 may be disposed on substantially the entire surface of the substrate 101. As shown in the exemplary embodiment of FIG. 6, the first insulating layer IL1 may be disposed on a top surface of the semiconductor layer ACT in the third direction DR3.

The first conductive layer 110 is disposed on the first insulating layer IL1. For example, as shown in the exemplary embodiment of FIG. 6, the first conductive layer 110 may be disposed on a top surface of the first insulating layer IL1 in the third direction DR3. The first conductive layer 110 may include at least one metal selected from among molybdenum (Mo), aluminum (Al), platinum (Pt), palladium (Pd), silver (Ag), Mg, gold (Au), nickel (Ni), neodymium (Nd), iridium (Ir), chromium (Cr), calcium (Ca), titanium (Ti), tantalum (Ta), tungsten (W), and copper (Cu). However, exemplary embodiments of the present inventive concepts are not limited thereto. The first conductive layer 110 may be a single-layer film or a multilayer film.

A scan line SL which is connected to gate electrodes G1 through G7 of the first through seventh transistors T1 through T7 may consist of the first conductive layer 110.

The second insulating layer IL2 insulates the first conductive layer 110 and the second conductive layer 120. The second insulating layer IL2 may be disposed on the first conductive layer 110. For example, the second insulating layer IL2 may be disposed on atop surface of the first conductive layer 110 in the third direction DR3. The second insulating layer IL2 may be disposed on substantially the entire surface of the substrate 101.

The second insulating layer IL2 may be an interlayer insulating film. The second insulating layer IL2 may include an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a PPS resin, or benzocyclobutene (BCB). However, exemplary embodiments of the present inventive concepts are not limited thereto. The second insulating layer IL2 may be a single-layer film or a multilayer film consisting of a stack of different materials.

The second conductive layer 120 is disposed on the second insulating layer IL2. For example, as shown in FIG. 6, the second conductive layer 120 may be disposed on a top surface of the second insulating layer IL2 in the third direction DR3. A second electrode CE2 of a storage capacitor Cst of the pixel PX may consist of the second conductive layer 120.

The second conductive layer 120 may include at least one metal selected from among Mo, Al, Pt, Pd, Ag, Mg, Au, Ni, Nd, Ir, Cr, Ca, Ti, Ta, W, and Cu. The second conductive layer 120 may be formed of the same material as the first conductive layer 110. However, exemplary embodiments of the present inventive concepts are not limited thereto. The second conductive layer 120 may be a single-layer film or a multilayer film.

The third insulating layer IL3 covers the second conductive layer 120. For example, the third insulating layer IL3 may be disposed on a top surface of the second conductive layer 120 in the third direction DR3. The third insulating layer IL3 insulates the second conductive layer 120 and the third conductive layer 130. The third insulating layer IL3 may be an interlayer insulating film. The third insulating layer IL3 may include an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a PPS resin, or BCB. However, exemplary embodiments of the present inventive concepts are not limited thereto. The third insulating layer IL3 may be a single-layer film or a multilayer film consisting of a stack of different materials.

The bending insulating layer IL0 is disposed in the bending area BR. The bending insulating layer IL0 is not disposed in the display area DA and is disposed only in the bending area BR. FIG. 6 illustrates that the top surfaces of the bending insulating layer IL0 and the third insulating layer IL3 have the same height (e.g., distance from a top surface of the substrate in the third direction DR3). However, exemplary embodiments of the present inventive concepts are not limited thereto. For example, the height of the top surface of the bending insulating layer IL0 may be less than the height of the top surface of the third insulating layer IL3. The bending insulating layer IL0 may be a via layer. The bending insulating layer IL0 may include an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a PPS resin, or BCB. However, exemplary embodiments of the present inventive concepts are not limited thereto.

The third conductive layer 130 is disposed on the third insulating layer IL3 in the display area DA and on the bending insulating layer IL0 in the bending area BR. The third conductive layer 130 may include at least one metal selected from among Mo, Al, Pt, Pd, Ag, Mg, Au, Ni, Nd, Ir, Cr, Ca, Ti, Ta, W, and Cu. However, exemplary embodiments of the present inventive concepts are not limited thereto. The third conductive layer 130 may be a single-layer film or a multilayer film. For example, the third conductive layer 130 may comprise a stack of Ti/Al/Ti, Mo/Al/Mo, Mo/AlGe/Mo, or Ti/Cu.

The third conductive layer 130 may include a data line DL, a first power supply voltage line VDL, a second gate electrode G1_2 of the first transistor T1, which is a driving transistor, a first connecting electrode BE1, and signal wires DL_BR which are disposed in the bending area BR.

The data line DL may be electrically connected to the second source region S2 of the second transistor T2 via a contact hole that penetrates the third insulating layer IL3, the second insulating layer IL2, and the first insulating layer IL1.

The first power supply voltage line VDL may be electrically connected to the second electrode CE2 of the storage capacitor Cst, which consists of the second conductive layer 120, via a contact hole that penetrates the third insulating layer IL3.

The first connecting electrode BE1 may be electrically connected to the sixth drain region D6 of the sixth transistor T6 via a contact hole that penetrates the third insulating layer IL3, the second insulating layer IL2, and the first insulating layer IL1.

The signal wires DL_BR, which are disposed in the bending area BR, may consist of the third conductive layer 130. The signal wires DL_BR may be disposed on the bending insulating layer IL0. The signal wires DL_BR may be substantially the same as the data lines DL1 through DL2m of FIGS. 1 and 2, and may include the first and second data lines DL(2i–1) and DL(2i) of FIG. 2.

FIG. 6 illustrates that the signal wires DL_BR consist of the third conductive layer 130. However, in other exemplary embodiments, the signal wires DL_BR may be formed of a layer other than the third conductive layer 130 or may be formed of the combination of the third conductive layer 130 and another layer.

Figure 7:
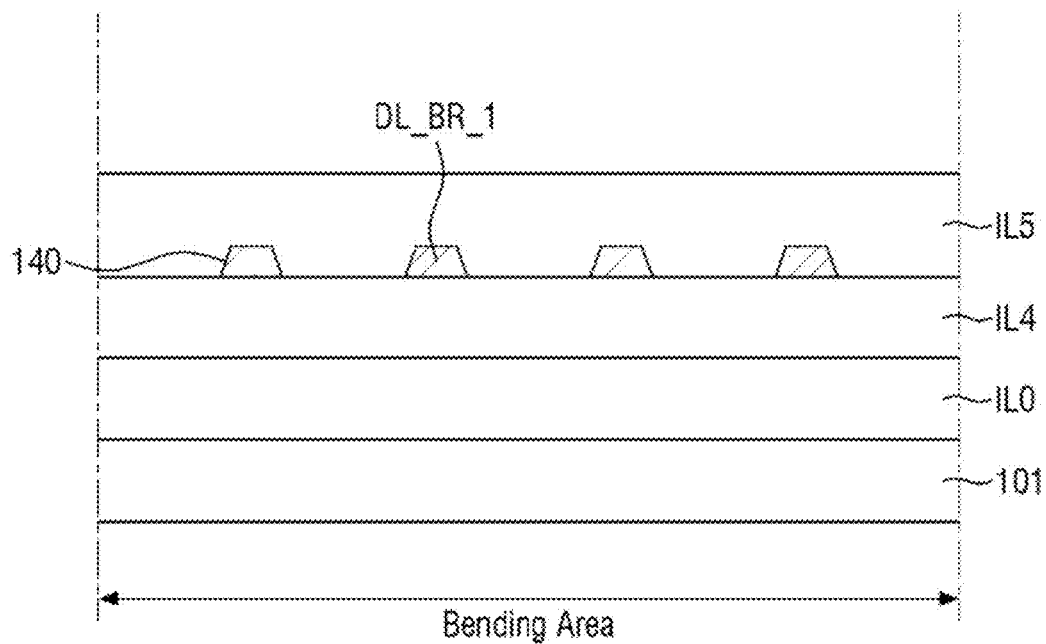
FIGS. 7 through 10 are cross-sectional views illustrating bending areas of display devices according to alternative exemplary embodiments of the present inventive concepts.
Figure 8:
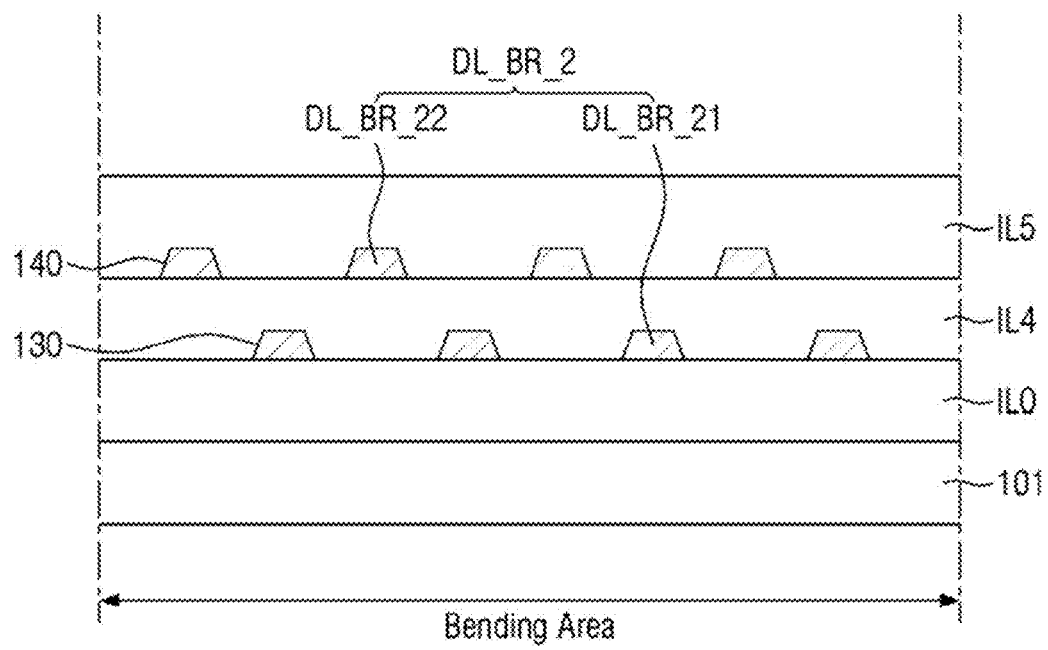
Figure 9:
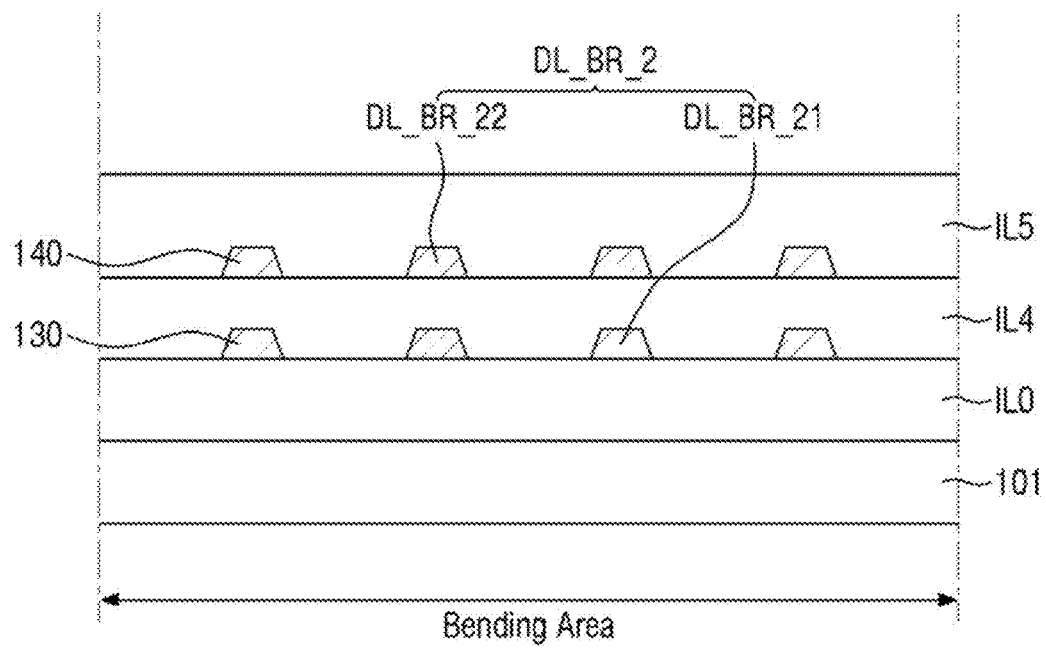

In another example, referring to FIG. 7, signal wires DL_BR_1 may consist of a fourth conductive layer 140. In this embodiment, the signal wires DL_BR_1 may be disposed on the fourth insulating layer IL4. For example, the signal wired DL_BR1 may be disposed on a top surface of the fourth insulating layer IL4 in the third direction DR3. In yet another exemplary embodiment shown in FIG. 8, signal wires DL_BR_2 may be included on different conductive layers. For example, the signal wires DL_BR_2 include first signal wires DL_BR_21 which consists of the third conductive layer 130, and the second signal wires DL_BR_22 may consist of the fourth conductive layer 140. The first signal wires DL_BR_21 and the second signal wires DL_BR_22 may be alternately arranged. For example, the first signal wires DL_BR_21 and the second signal wires DL_BR_22 may not overlap in the direction of the thickness of the substrate (e.g., the third direction DR3). However, exemplary embodiments of the present inventive concepts are not limited thereto. For example, in the exemplary embodiment shown in FIG. 9, the first signal wires DL_BR_21 may at least partially overlap with the second signal wires DL_BR_22.

Figure 10:
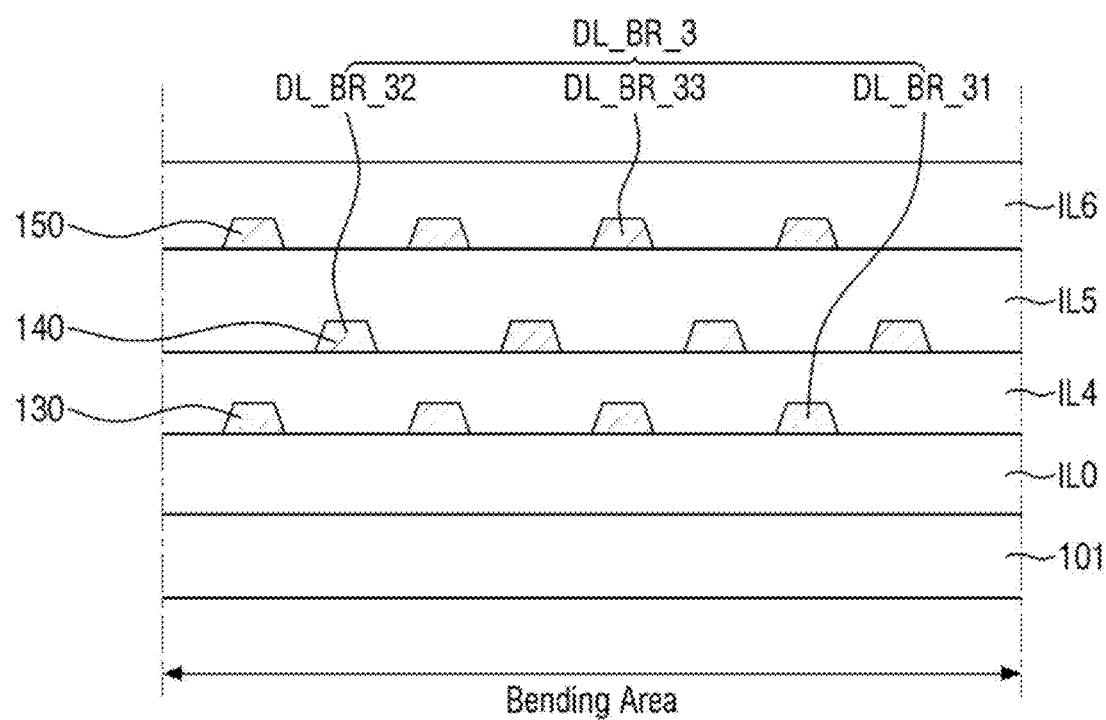

Referring to FIG. 10, signal wires DL_BR_3 may be included on three different conductive layers. For example, signal wires DL_BR_3 include first signal wires DL_BR_31 consisting of the third conductive layer 130, second signal wires DL_BR_32 consisting of the fourth conductive layer 140, and third signal wires DL_BR_33 consisting of a fifth conductive layer 150. As shown in the exemplary embodiment of FIG. 10, the first signal wires DL_BR_31 and the second signal wires DL_BR_32 may be alternately arranged so that the first signal wires DL_BR_31 and the second signal wires DL_BR32 may not overlap in the direction of the thickness of the substrate (e.g., the third direction DR3). Also, the second signal wires DL_BR_32 and the third signal wires DL_BR_33 may be alternately arranged so that the second signal wires DL_BR_32 and the third signal wires DL_BR_33 may not overlap in the thickness direction. In this embodiment, the first signal wires DL_BR_31 and the third signal wires DL_BR_33 may at least partially overlap in the thickness direction.

However, exemplary embodiments of the present inventive concepts are not limited to the embodiments shown in FIGS. 6-10. For example, in other exemplary embodiments of the present inventive concepts, the signal wires may be included on four or more different conductive layers.

In an exemplary embodiment where the signal wires DL_BR_2 or DL_BR_3 consist of different conductive layers, different data signals may be provided to the different conductive layers. For example, in an embodiment where the data signals output from the data driver 30 include first and second data signals, the demultiplexer DEMUX may provide the first data signal to the first signal wires DL_BR_21 or DL_BR_31 and may provide the second data signal to the second signal wires DL_BR_22 or DL_BR_32. However, exemplary embodiments of the present inventive concepts are not limited thereto. For example, in another exemplary embodiment, the demultiplexer DEMUX may provide the second data signal to the first signal wires DL_BR_21 or DL_BR_31 and may provide the first data signal to the second signal wires DL_BR_22 or DL_BR_32.

The fourth insulating layer IL4 covers the third conductive layer 130. The fourth insulating layer IL4 may be a via layer disposed on the bending insulating layer IL0 in the bending area BR. The fourth insulating layer IL4 may include the same material as the bending insulating layer IL or may include at least one of the aforementioned exemplary materials that may be used to form the bending insulating layer IL0.

FIG. 6 illustrates that the transistors T1 through T7 of the pixel PX have a top gate structure in which the gate electrodes G1 through G7 are disposed above the active element layer ACT. However, exemplary embodiments of the present inventive concepts are not limited thereto. For example, in another embodiment, the transistors T1 through T7 of the pixel PX may have a bottom gate structure in which the gate electrodes GI through G7 are disposed below the active element layer ACT or may have a double gate structure in which the gate electrodes (G1 through G7) are disposed both above and below the active element layer ACT.

The first electrode layer 160 is disposed on the fourth insulating layer IL4. An anode electrode ANO of the pixel PX may consist of the first electrode layer 160. The anode electrode ANO may be electrically connected to the first connecting electrode BE1, which consists of the third conductive layer 130, via a contact hole that penetrates the fourth insulating layer IL4. Therefore, the anode electrode ANO may be connected to the sixth drain region D6 of the sixth transistor T6.

The first electrode layer 160 may have a structure which includes a layer of a high-work function material such as indium tin oxide (ITO), indium zinc oxide (IZO), zinc oxide (ZnO), or indium oxide ($In_2O_3$) and a layer of a reflective material such as Ag, Mg, Al, Pt, lead (Pb), Au, Ni, Nd, Ir, Cr, lithium (Li), calcium (Ca), or a mixture thereof that are stacked. The high-work function layer may be disposed above the reflective material layer to be close to the organic layer 180. The first electrode layer 160 may have a multilayer structure of ITO/Mg, ITO/MgF, ITO/Ag, or ITO/Ag/ITO. However, exemplary embodiments of the present inventive concepts are not limited thereto.

The pixel-defining layer 170 may be disposed on the first electrode layer 160. The pixel-defining layer 170 may include an opening which exposes the first electrode layer 160. The pixel-defining layer 170 may include an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a PPS resin, or BCB. However, exemplary embodiments of the present inventive concepts are not limited thereto. The pixel-defining layer 170 may be a single-layer film or a multilayer film consisting of a stack of different materials.

The organic layer 180 is disposed in the opening of the pixel-defining layer 170. The organic layer 180 may include an organic light-emitting layer, a hole injection/transport layer, and an electron injection/transport layer.

The second electrode layer 190 is disposed on the organic layer 180 and the pixel-defining layer 170. A cathode electrode CAT may consist of the second electrode layer 190. The cathode electrode CAT may be disposed in the entire display area DA. The second electrode layer 190 may include a layer of a low-work function material such as Li, Ca, LiF/Ca, LiF/Al, Al, Mg, Ag, Pt, Pd, Ni, Au Nd, Ir, Cr, BaF, Ba, or a compound or mixture thereof(e.g., the mixture of Ag and Mg). The second electrode layer 190 may further include a transparent metal oxide layer which is disposed on the low-work function material layer.

As described above, the demultiplexing circuit unit 60 is disposed in the sub-area SR. Therefore, even when the demultiplexing circuit unit 60 overlaps with the display area DA, the demultiplexing circuit unit 60 can be prevented from becoming visible from the front of the display panel 100. As a result, dead space of the display device 1 due to the demultiplexing circuit unit 60 is prevented.

A display device according to another exemplary embodiment of the present disclosure will hereinafter be described.

Figure 11:
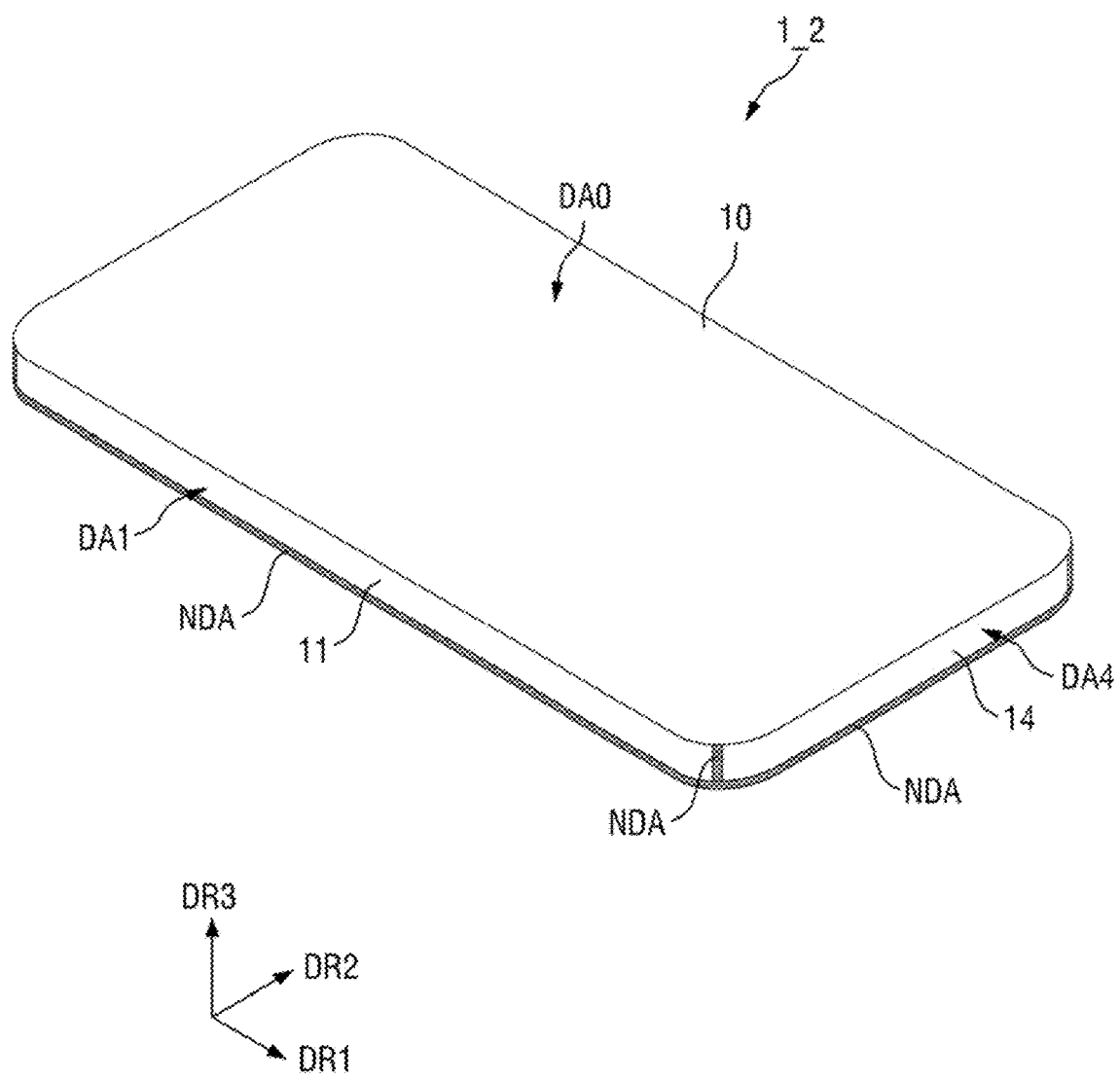
FIG. 11 is a perspective view of a display device according to another exemplary embodiment of the present inventive concepts.
Figure 12:
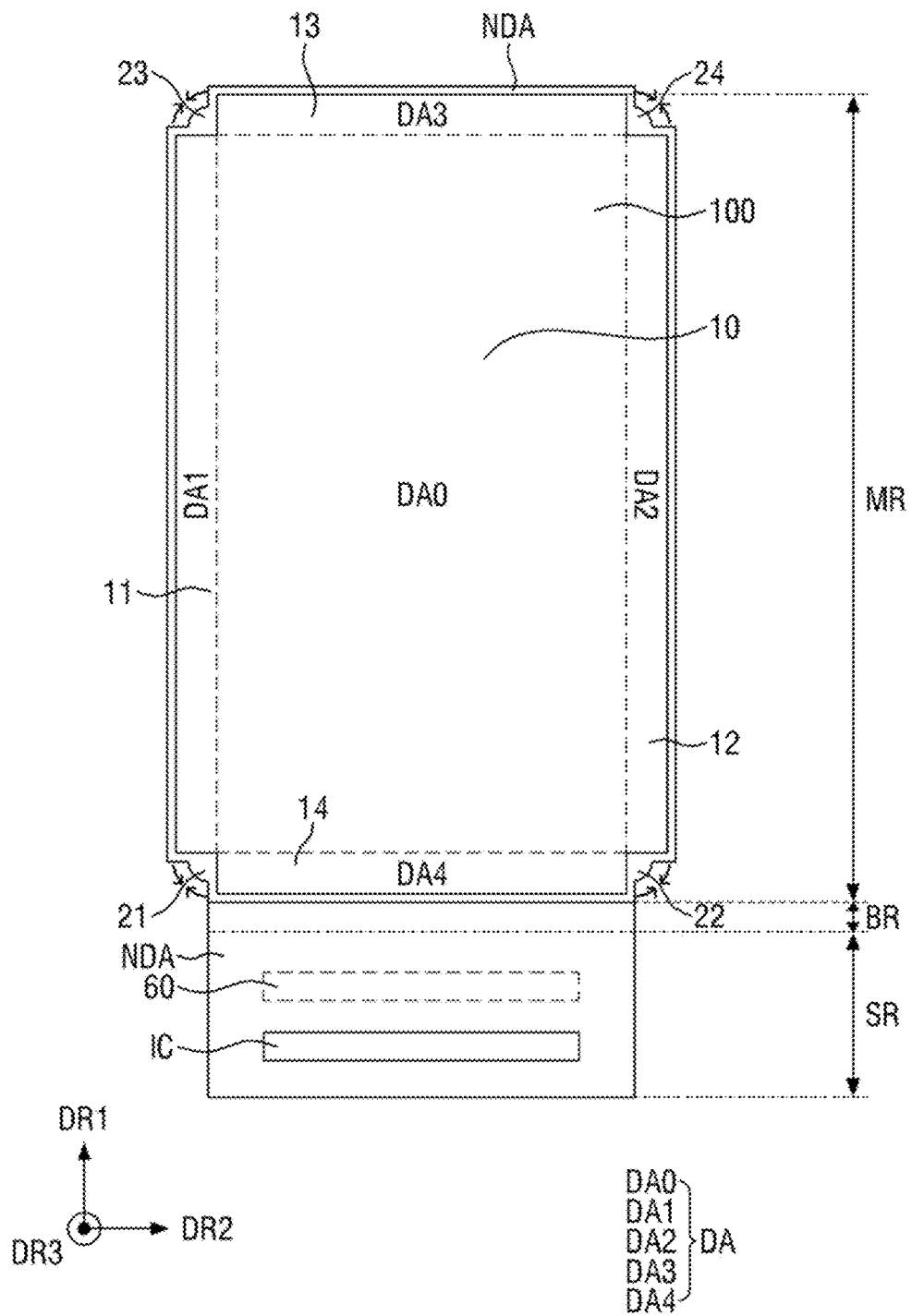
FIG. 12 is an exploded plan view of the display device of FIG. 11 according to an exemplary embodiment of the present inventive concepts.
Figure 13:
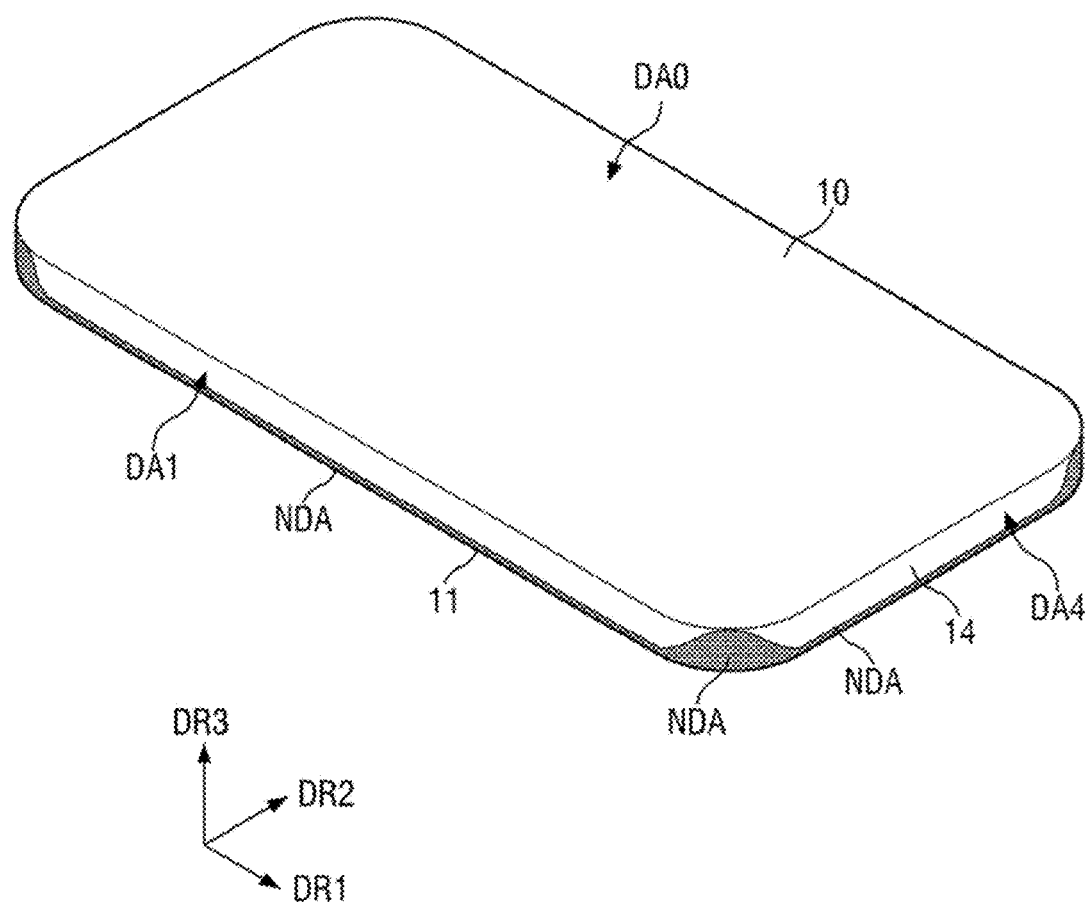
FIG. 13 is a perspective view of an alternative embodiment of the display device of FIG. 11 according to an exemplary embodiment of the present inventive concepts.
Figure 14:
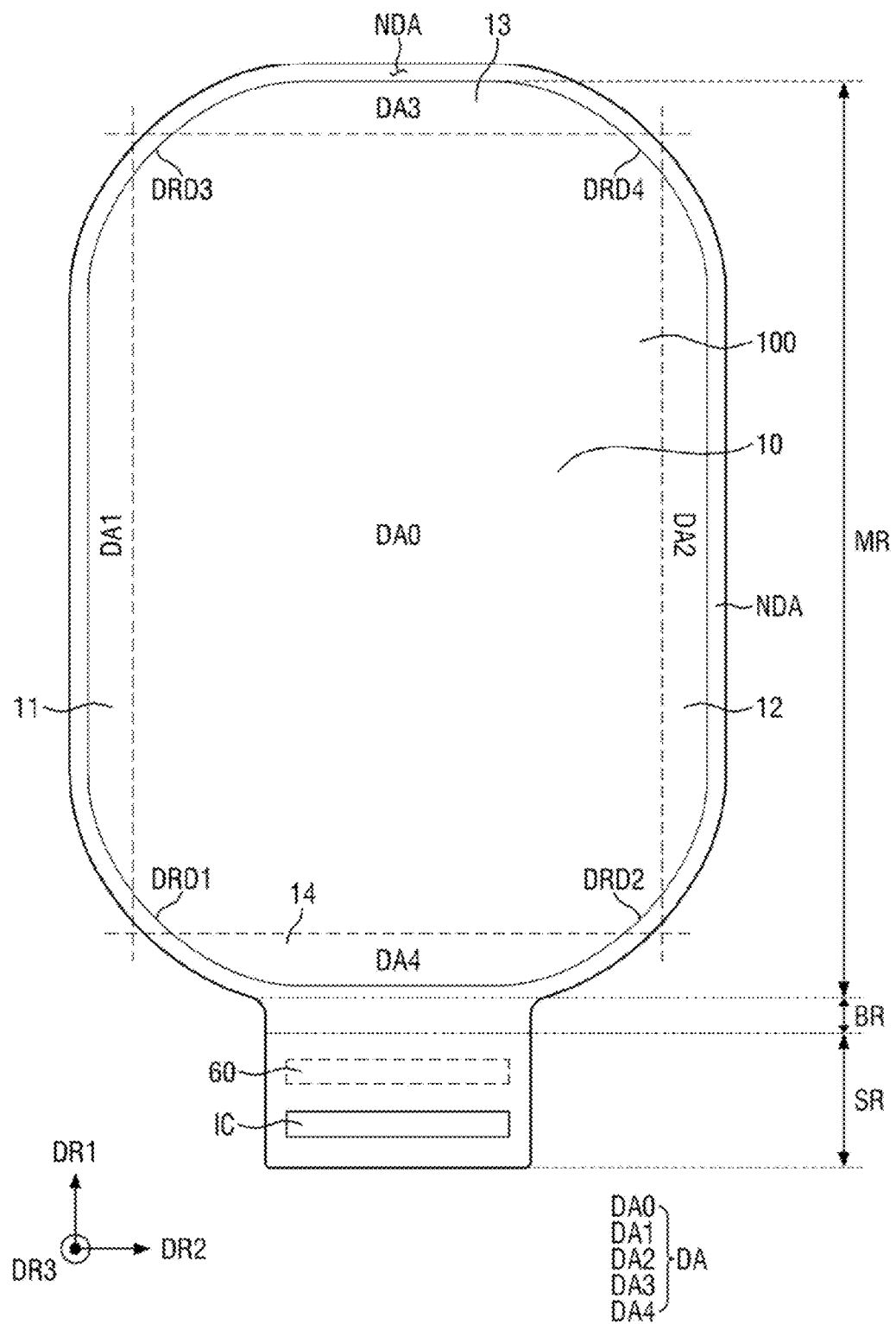
FIG. 14 is an exploded plan view of the display device of FIG. 13 according to an exemplary embodiment of the present inventive concepts.

FIG. 11 is a perspective view of a display device according to another exemplary embodiment of the present disclosure. FIG. 12 is an exploded plan view of the display device of FIG. 11. FIG. 13 is a perspective view of an alternative embodiment of the display device of FIG. 11. FIG. 14 is an exploded plan view of the display device of FIG. 13.

Referring to FIGS. 11 through 14, a display device 1_2 may include a main display surface 10 and a plurality of sub-display surfaces 11 through 14.

The main display surface 10 may have a substantially plate shape, may be disposed on one plane defined in the first direction DR1 and the second direction DR2 of the display device 1_2, and may be larger in size than the sub-display surfaces 11 through 14. For example, the main display surface 10 may be disposed on the top surface of the display device 1_2 in the third direction DR3 and may extend in the first direction DR1 and second direction DR2. The main display surface 10 may have various planar shapes such as a polygonal shape (e.g., a rectangular shape), a circular shape, an elliptical shape, etc.

The sub-display surfaces 11 through 14 may be disposed on different planes from the main display surface 10. For example, as shown in FIGS. 11-12, the sub-display surfaces 11 and 12 may be disposed on a plane defined in the first direction DR1 and the third direction DR3. The sub-display surfaces 13 and 14 may be disposed on a plane defined in the second direction DR2 and the third direction DR3. The sub-display surfaces 11 through 14 may be smaller in size than the main display surface 10. The sub-display surfaces 11 through 14 may be connected to, and bent or folded from, the sides of the main display surface 10.

For example, in an exemplary embodiment in which the main display surface 10 has a rectangular shape, the display device 1_2 may include four sub-display surfaces, e.g., first through fourth sub-display surfaces 11 through 14, and the first through fourth sub-display surfaces may be connected to four sides of the main display surface 10. In this exemplary embodiment, the display device 1_2 may be a stereoscopic display device displaying images on its top surface and its side surfaces connected to the top surface. However, in other exemplary embodiments, the display device 1_2 may include a different number of sub-display surfaces.

As shown in FIG. 11, the display area DA of the display device 1_2 may include a main display area DA0 and first through fourth sub-display areas DA1 through DA4 that are on the first through fourth sub-display surfaces 11 through 14, respectively.

The main display area DA0 may be disposed on the main display surface 10. For example, in an exemplary embodiment, the main display surface 10 may include only the main display area DA0. The first sub-display area DA1 may be disposed on the first sub-display surface 11 and may be connected to the main display area DA0. Similarly, the second through fourth sub-display areas DA2 through DA4 may be disposed on the second through fourth sub-display surfaces 12 through 14, respectively, and may be connected to the main display area DA0.

The main display area DA0 and the first through fourth sub-display areas DA1 through DA4 may be disposed in a main area MR.

In an exploded view, a non-display area NDA may be disposed along the outermost edges of each of the main-display area 10 and the sub-display surfaces 11 through 14.

The non-display area NDA may include first through fourth corner parts 21 through 24. Each of the first through fourth corner parts 21 through 24 may be disposed adjacent to a pair of adjacent sides of the main display surface 10 (e.g., a location where the pair of adjacent sides meet).

The first through fourth corner parts 21 through 24 may be substantially the same except for their locations. The first through fourth corner parts 21 through 24 will hereinafter be described, taking the first corner part 21 as an example.

The first corner part 21 may protrude outwardly from a corner of the main display surface 10 (e.g., in the first direction DR1 and second direction DR2). The first corner part 21 is disposed between the first and fourth sub-display surfaces 11 and 14 (or between the first and fourth sub-display areas DA1 and DA4) and provides an obtuse angle between the first and fourth sub-display surfaces 11 and 14. A first end of the first corner part 21 is connected to the first sub-display surface 11, and a second end of the first corner part 21 is connected to the fourth sub-display surface 14.

The first corner part 21 may provide a space where signal wires can be arranged or can pass thereby. When the first and fourth sub-display surfaces 11 and 14 are folded or bent, the first corner part 21 may be folded inwardly towards the rear surface of the main display area DA0. In this embodiment, the first end of the first corner pan 21, e.g., a portion of the first corner pan 21 adjacent to the first sub-display surface 11, and the second end of the first corner part 21, e.g., a portion of the first corner part 21 adjacent to the fourth sub-display surface 14, may face each other. In an exemplary embodiment, the first and second ends of the first corner part 21 may adjoin each other or may be coupled to each other via a bonding layer.

Since the first corner part 21 is folded inwardly when the first and fourth sub-display surfaces 11 and 14 are folded, the first corner part 21 may not be exposed (e.g., may not be included on the plane of the main display area DA0 defined in the first direction DR1 and second direction DR2). Therefore, the first through fourth corner parts 21 through 24 can be included in the non-display area NDA.

The non-display area NDA further includes a bending area BR and a sub-area SR, and the bending area BR may be connected to at least one of the first through fourth sub-display surfaces 11 through 14. For example, the bending area BR may be connected to one side of the fourth sub-display surface 14 (e.g., a lower side of the fourth sub-display surface 14 in an exploded view).

As illustrated in FIG. 11, when the fourth sub-display surface 14 is folded or bent perpendicularly from the main display surface 10, the bending area BR may be folded or bent perpendicularly from the fourth sub-display surface 14 (e.g., by an angle of 180 degrees with respect to the main display surface 10) so that the sub-area SR, which is disposed on one side of the bending area BR, may be disposed below the main display surface 10 in a direction of the thickness of the device. The sub-area SR may overlap with the main display surface 10 and may be parallel to the main display surface 10.

A driving chip IC and a demultiplexing circuit unit 60 may be disposed in the sub-area SR. The driving chip IC may include a data driver 30 which generates and provides data signals. As previously discussed, since the sub-area SR is bent from the main display surface 10 and is thus reversed, the top surface of the driving chip IC may face the opposite direction of the third direction DR3. The driving chip IC may be substantially the same as its counterpart of FIGS. 4 and 5, and thus, a detailed description thereof will be omitted.

The demultiplexing circuit unit 60 may be disposed in the sub-area SR. The demultiplexing circuit 60 may be disposed in the sub-area SR between one of the sub-display surfaces 11 through 14 and the driving chip IC. For example, as shown in the exemplary embodiment of FIG. 12, the demultiplexing circuit unit 60 may be disposed between the fourth sub-display surface 14 and the driving chip IC. The demultiplexing circuit 60 and the driving chip IC may be spaced apart in the first direction DR1.

As the sub-area SR is folded from the main display surface 10 and is thus reversed, the demultiplexing circuit unit 60 and the main display area DA may overlap in the third direction DR3. Also, the demultiplexing circuit unit 60 may overlap with the bottom surface of a display panel 100. Accordingly, even when the demultiplexing circuit unit 60 overlaps with the main display area DA0, the demultiplexing circuit unit 60 can be prevented from becoming visible from the front of the display panel 100. Therefore, dead space located in the front of the display panel 100 of the display device 1_2 due to the demultiplexing circuit unit 60 can be prevented. The demultiplexing circuit unit 60 may be substantially the same as its counterpart of FIGS. 1 through 5, and thus, a detailed description thereof will be omitted.

FIGS. 11 and 12 illustrate that the display panel 100 includes the first through fourth corner parts 21 through 24, which protrude outwardly from the corners of the main display surface 10. However, exemplary embodiments of the present inventive concepts are not limited thereto. For example, in an alternative embodiment, as illustrated in FIGS. 13 and 14, the display panel 100 may include first through fourth display round parts DRD1 through DRD4 which are disposed at the corners of the main display surface 10. The first through fourth display round parts DRD1 through DRD4 may be substantially the same except for their locations. The first through fourth display round parts DRD1 through DRD4 will hereinafter be described, taking the first display round part DRD1 as an example.

The first display round part DRD1 is disposed between the first and fourth sub-display surfaces 11 and 14 (or between the first and fourth sub-display areas DA1 and DA4). One end of the first display round part DRD1 extends to the end of the first sub-display surface 11, and the other end of the first display round part DRD1 extends to the end of the fourth sub-display surface 14.

In exemplary embodiments, the first through fourth display round parts DRD1 through DRD4 may have substantially the same curvature or different curvatures. Alternatively, at least two of the first through fourth display round parts DRD1 through DRD4 may have substantially the same curvature. Still alternatively, each of the first through fourth display round parts DRD1 through DRD4 may have a substantially uniform curvature or a variable curvature.

Since the demultiplexing circuit unit 60 is disposed in the sub-area SR, the demultiplexing circuit unit 60 can be disposed adjacent to the rear surface of the display panel 100, and as a result, an increase in dead space located in the front of the display panel 100 due to the demultiplexing circuit unit 60 can be prevented.

Wires for transmitting driving signals will hereinafter be described with reference to FIGS. 15 through 18, taking the display device 1_2 of FIGS. 11 and 12 as an example.

Figure 15:
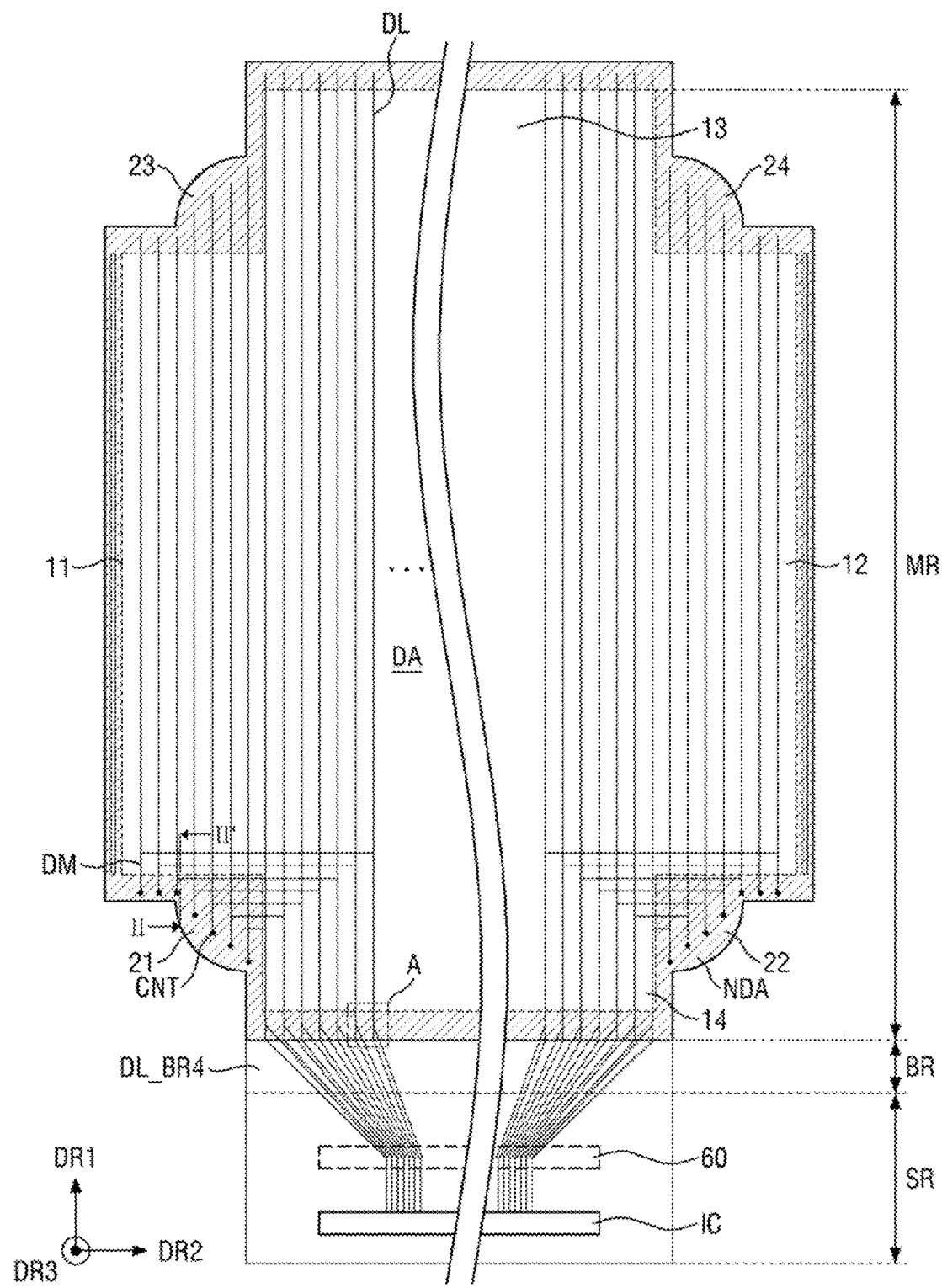
FIG. 15 is a plan view of the display device of FIG. 11 according to an exemplary embodiment of the present inventive concepts.
Figure 16:
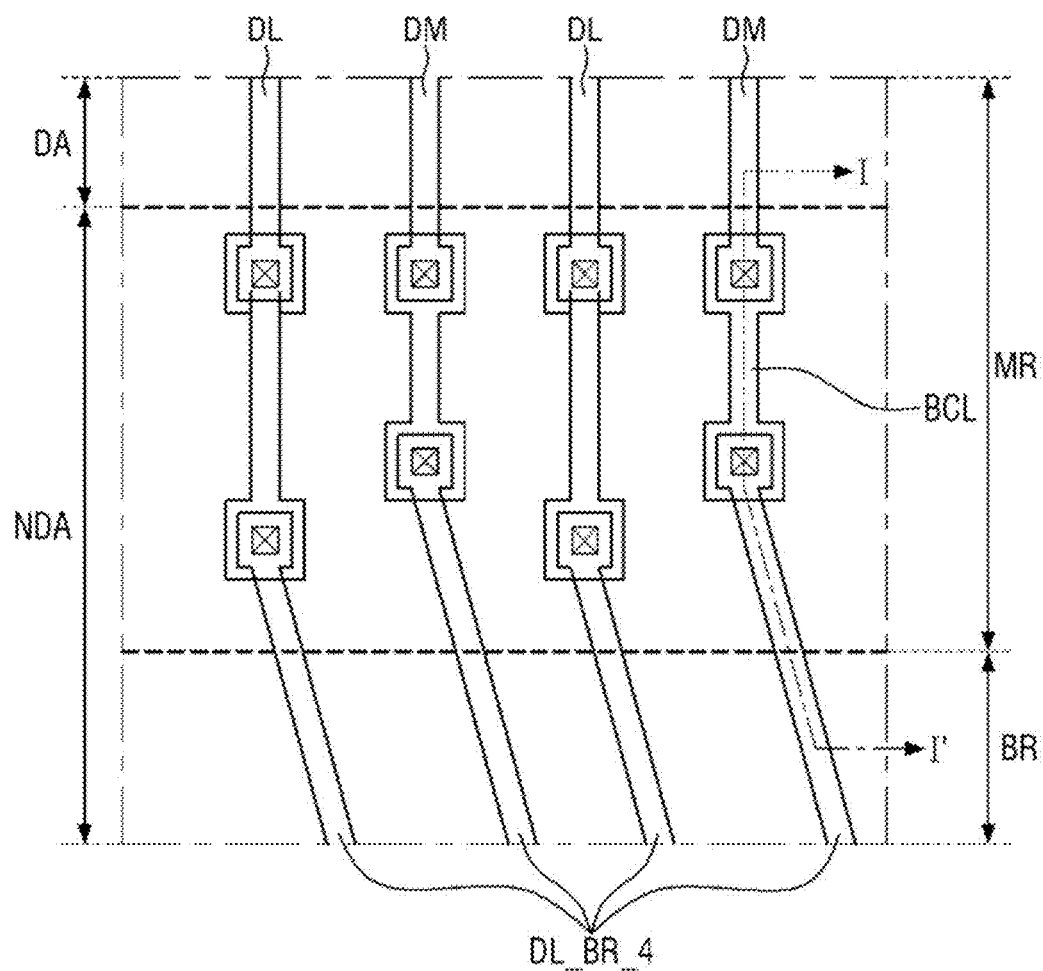
FIG. 16 is an enlarged plan view illustrating an area A of FIG. 15 according to an exemplary embodiment of the present inventive concepts.
Figure 17:
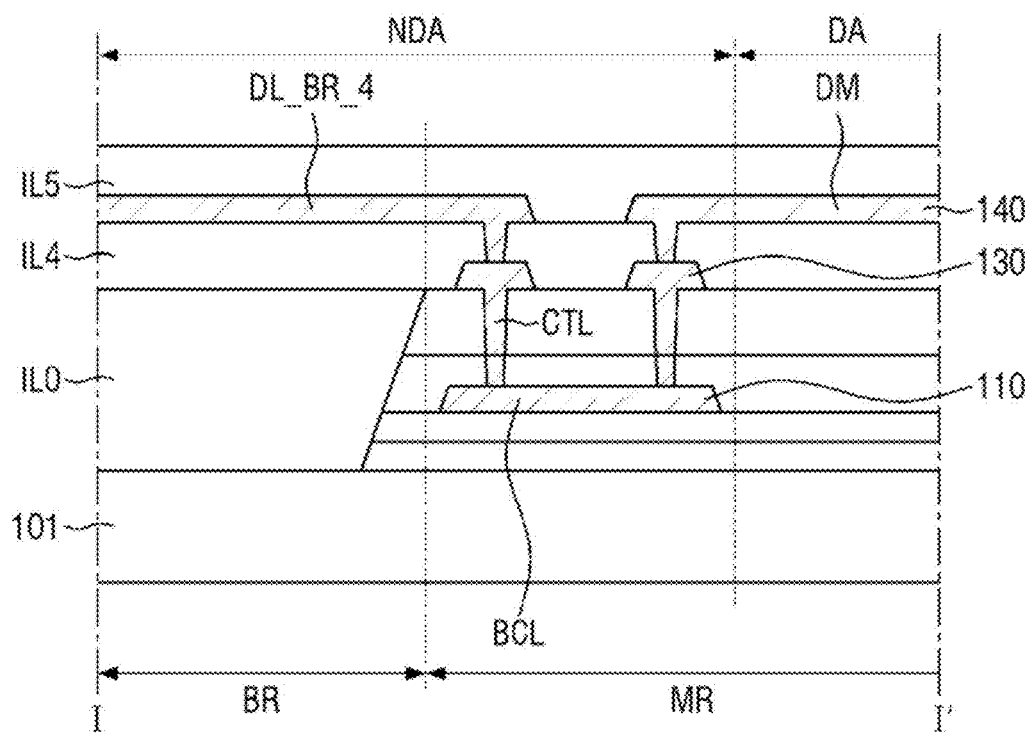
FIG. 17 is a cross-sectional view taken along line I-I' of FIG. 16 according to an exemplary embodiment of the present inventive concepts.
Figure 18:
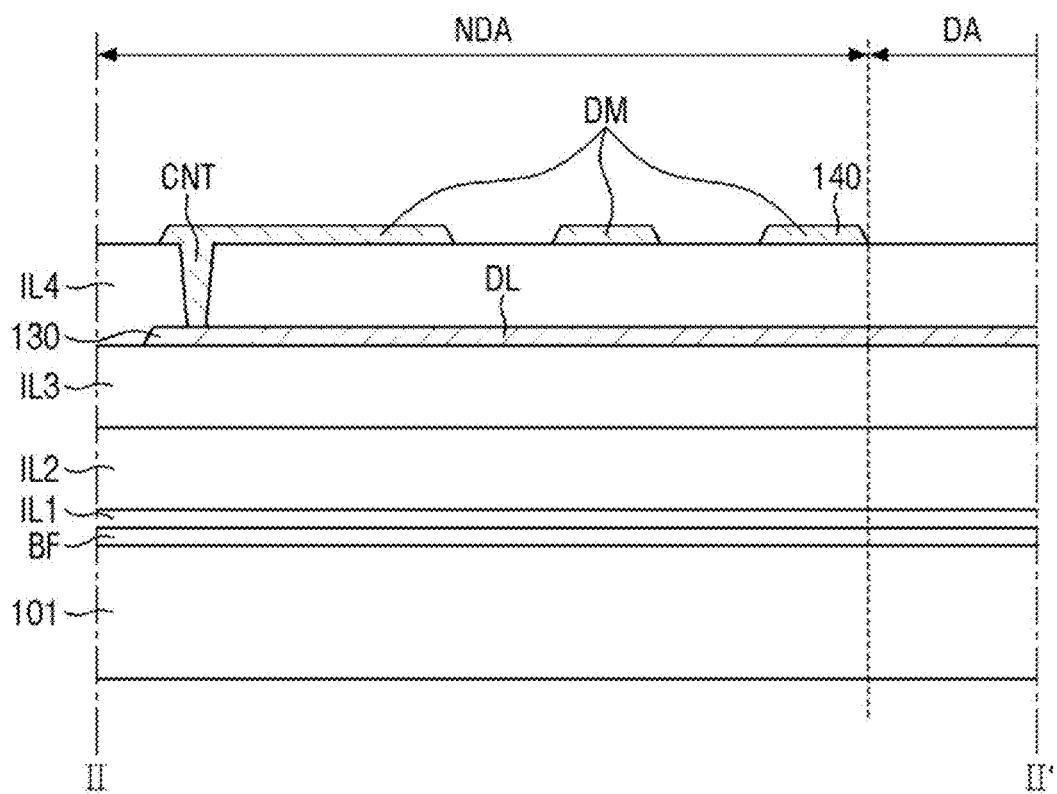
FIG. 18 is a cross-sectional view taken along line II-II' of FIG. 15 according to an exemplary embodiment of the present inventive concepts.

FIG. 15 is a plan view of the display device of FIG. 11. FIG. 16 is an enlarged plan view illustrating an area A of FIG. 15. FIG. 17 is a cross-sectional view taken along line I-I' of FIG. 16. FIG. 18 is a cross-sectional view taken along line II-II' of FIG. 15.

Referring to FIGS. 15 through 18, the display device 1_2 may include data lines DL, connecting wires DM, signal wires DL_BR_4, and bending connecting wires BCL. In an exemplary embodiment, the data lines DL and the connecting wires DM may extend in a first direction DR1 and may be symmetrical with respect to a reference axis that penetrates the center of the display device 1_2.

The data lines DL may extend in the first direction DR1 and may be sequentially arranged at predetermined intervals along a second direction DR2. The data lines DL may extend across the display area DA along the first direction DR1.

The connecting wires DM may electrically connect some of the data lines DL and some of the signal wires DL_BR_4. The connecting wires DM may be disposed in a different layer from the data line DL and may be insulated from the data lines DL by an insulating layer. This will be described later with reference to FIG. 18.

The connecting wires DM may extend from part of the non-display area NDA below the fourth sub-display surface 14 upwardly in the first direction DR1, may then extend along the opposite direction of the second direction DR2 in the display area DA, and may then extend to the ends of the data lines DL, e.g., to part of the non-display area NDA below the first sub-display surface 11. Each of the connecting wires DM may not intersect one another, but may bypass one another. FIG. 15 illustrates that the connecting wires DM are bent at a right angle. However, exemplary embodiments of the present inventive concepts are not limited thereto.

The signal wires DL_BR_4 may transmit data signals output by the demultiplexing circuit unit 60 to the data lines DL and the connecting wires DM. As shown in the exemplary embodiments in FIGS. 16 and 17, the signal wires DL_BR_4 may be electrically connected to the connecting lines DM or the data lines DL by the bending connecting wires BCL. The signal wires DL_BR_4 may extend from the bending area BR to the main area MR to be electrically connected, in the non-display area NDA, to contact wires CTL and thus to be electrically connected to the bending connecting wires BCL.

As shown in the exemplary embodiment of FIG. 17, the signal wires DL_BR_4 and the connecting wires DM may consist of a fourth conductive layer 140, the contact wires CTL may consist of a third conductive layer 130, and the bending connecting wires BCL may consist of a first conductive layer 110. In the non-display area NDA of the main area MR, the signal wires DL_BR_4 may be electrically connected to the contact wires CTL via contact holes that penetrate a fourth insulating layer IL4, and the contact wires CTL may be electrically connected to first ends of the bending connecting wires BCL via contact holes that penetrate a third insulating layer IL3 and a second insulating layer IL2. In the non-display area NDA of the main area MR, second ends of the bending connecting wires BCL may be electrically connected to the contact wires CTL via contact holes that penetrate the third insulating layer IL3 and the second insulating layer IL2, and the contact wires CTL may be electrically connected to the connecting wires DM via contact holes that penetrate the fourth insulating layer IL4. Accordingly, the signal wires DL_BR_4 can transmit the data signals output by the demultiplexing circuit unit 60 to the connecting wires DM and to the data lines DL. This will be described later in detail.

FIGS. 16 and 17 illustrate that the signal wires DL_BR_4 and the connecting wires DM consist of the fourth conductive layer 140, that the contact wires CTL consist of the third conductive layer 130, and that the bending connecting wires BCL consist of the first conductive layer 110. However, exemplary embodiments of the present inventive concepts are not limited thereto. For example, the bending connecting wires BCL may consist of a second conductive layer 120. In this embodiment, the bending connecting wires BCL may be electrically connected to the contact wires CTL via contact holes that penetrate the third insulating layer IL3. However, the present disclosure is not limited to this. For example, in other exemplary embodiments, the contact wires CTL may not be provided, and the bending connecting wires BCL may be electrically connected directly to the signal wires DL_BR_4 or the connecting wires DM via contact holes that penetrate the third and fourth insulating layers IL3 and IL4.

The signal wires DL_BR and the connecting wires DM may consist of two different conductive layers. In this embodiment, the signal wires DL_BR and the connecting wires DM may be directly connected via contact holes that penetrate an insulating film disposed between the two different conductive layers, and the bending connecting wires BCL and the contact wires CTL may not be provided.

Referring again to FIG. 15, the connecting wires DM may extend from the fourth sub-display surface 14 to the part of the non-display area NDA below the first sub-display surface 11 through the display area DA. The connecting wires DM may be a predetermined distance apart from one another in the second direction DR2, and the distance between the connecting wires DM may be the same as the distance between the data lines DL. Accordingly, in a plan view, the connecting wires DM may at least partially overlap with the data lines DL. The connecting wires DM may be directly connected one-to-one to the data lines DL via contact holes CNT which are formed in lower parts of the first and second sub-display surfaces 11 and 12, e.g., in the first and second corner parts 21 and 22.

Referring to the exemplary embodiment of FIG. 18, the connecting wires DM may consist of the fourth conductive layer 140, the data lines DL may consist of the third conductive layer 130, and the connecting wires DM may be insulated from the data lines DL by the fourth insulating layer IL4. The connecting wires DM may extend to the ends of the data lines DL and may be electrically connected to the data lines DL via the contact holes CNT which penetrate the fourth insulating layer IL4 to expose the ends of the data lines DL. Accordingly, the data signals output by the demultiplexing circuit unit 60 can be transmitted to the data lines DL via the connecting wires DM.

As described above, the display device 1_2 includes the connecting wires DM, which are disposed to pass through the display area DA, and image signals can be provided from the demultiplexing circuit unit 60 to data lines DL disposed in the first and second sub-display surfaces 11 and 12, via the connecting wires DM. Accordingly, additional dead space may be unnecessary for directly connecting the data lines DL disposed in the first and second sub-display surfaces 11 and 12 to the signal wires DL_BR_4. Therefore a reduction of dead space may be accomplished.

The structure of a pixel PX of the display device 1_2 will hereinafter be described.

Figure 19:
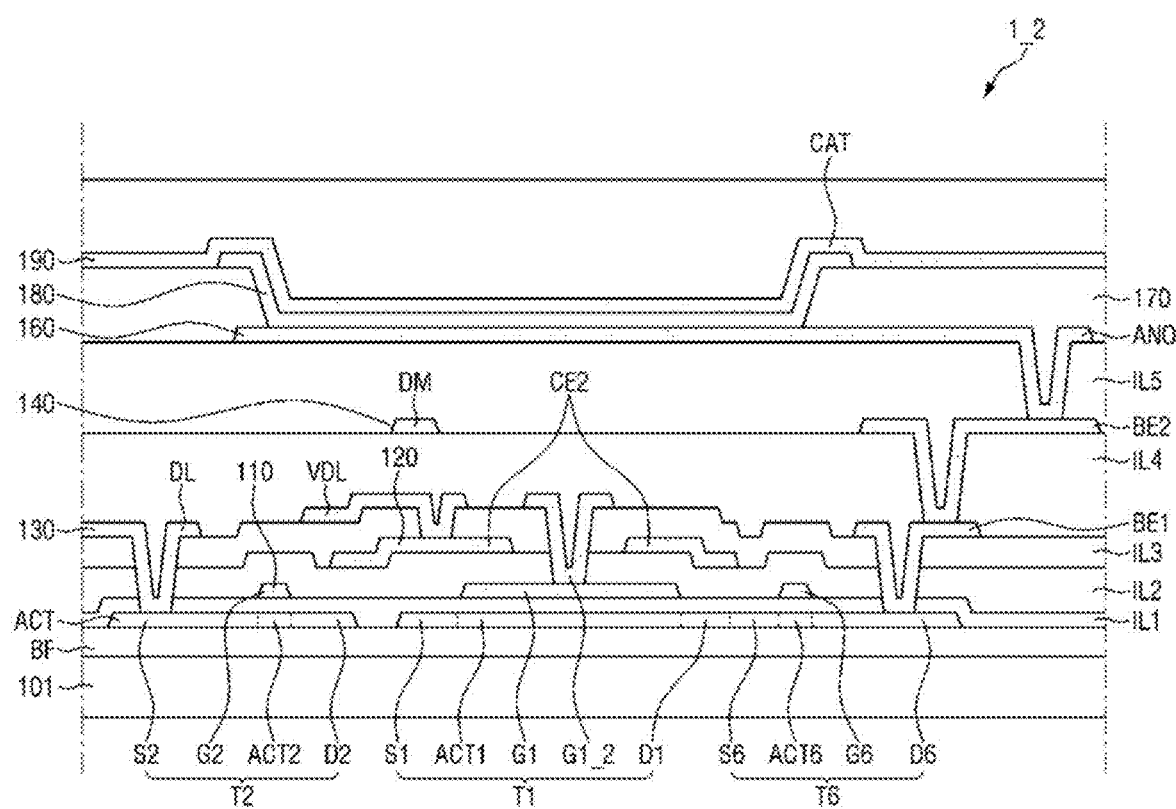
FIG. 19 is a cross-sectional view illustrating a pixel of the display device of FIG. 11 according to an exemplary embodiment of the present inventive concepts.

FIG. 19 is a cross-sectional view illustrating a pixel of the display device of FIG. 11.

Referring to FIG. 19, the display device 1_2 differs from the display device 1 of FIG. 6 by the inclusion of the fourth conductive layer 140 and a fifth insulating layer IL5. The display device 1_2 is substantially the same as the display device 1 of FIG. 6 and thus will hereinafter be described, focusing mainly on the differences with the display device 1 of FIG. 6.

The fourth conductive layer 140 is disposed on the fourth insulating layer IL4. The fourth conductive layer 140 may include at least one metal selected from among Al, Mo, Pt, Pd, Ag, Mg, Au, Ni, Nd, Ir, Cr, Ca, Ti, Ta, W, and Cu. The fourth conductive layer 140 may be a single-layer film or a multilayer film. For example, the fourth conductive layer 140 may be formed to have a stack of Ti/Al/Ti, Mo/Al/Mo, Mo/AlGe/Mo, or Ti/Cu. The fourth conductive layer 140 may be formed of the same material as the third conductive layer 130. However, exemplary embodiments of the present inventive concepts are not limited thereto.

The fourth conductive layer 140 may include a connecting wire DM and a second connecting electrode BE2. The connecting wire DM may be disposed to overlap with a first power supply voltage line VDL in the direction of the thickness of the substrate. Accordingly, the coupling between a gate electrode G1 of a first transistor T1 and the connecting wire DM can be reduced. The second connecting electrode BE2 may be electrically connected to a first connecting electrode BE1 which consists of the third conductive layer, via a contact hole that penetrates the fourth insulating layer IL4.

The fifth insulating layer IL5 covers the fourth conductive layer 140. The fifth insulating layer IL5 may be a via layer. The fifth insulating layer IL5 may include the same material as a bending insulating layer IL0 or may include at least one of the aforementioned exemplary materials that may be used to form the bending insulating layer IL0.

A first electrode layer 160 is disposed on the fifth insulating layer IL5. An anode electrode ANO of a pixel PX of the display device 1_2 may consist of the first electrode layer 160. The anode electrode ANO may be electrically connected to the second connecting electrode BE2, which consists of the fourth conductive layer 140, via a contact hole that penetrates the fifth insulating layer IL5.

A display device according to another exemplary embodiment of the present inventive concepts will hereinafter be described.

Figure 20:
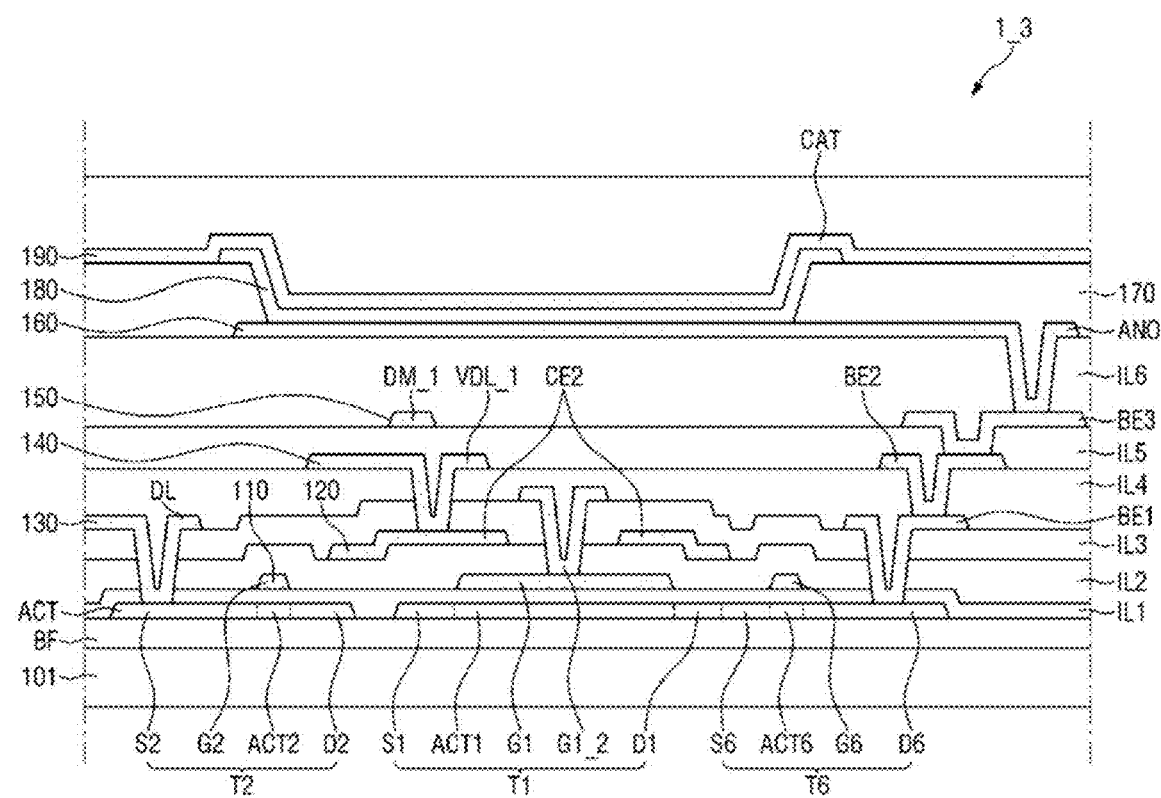
FIG. 20 is a cross-sectional view illustrating a pixel of a display device according to another exemplary embodiment of the present inventive concepts.

FIG. 20 is a cross-sectional view illustrating a pixel of a display device according to another exemplary embodiment of the present inventive concepts.

Referring to FIG. 20, a display device 1_3 differs from the display device 1_2 of FIG. 19 by the inclusion of a fifth conductive layer 150 and a sixth insulating layer IL6, and a fourth conductive layer 140 includes a first power supply voltage line VDL_1. The display device 1_3 of FIG. 20 is substantially the same as the display device 1_2 of FIG. 19 and thus will hereinafter be described, focusing mainly on the differences with the display device 1_2 of FIG. 19.

The fourth conductive layer 140 is disposed on a fourth insulating layer IL4. The fourth conductive layer 140 may include a first power supply voltage line VDL_1 and a second connecting electrode BE2. The first power supply voltage line VDL_1 may be electrically connected to a second electrode CE2 of a storage capacitor Cst via a contact hole that penetrates the fourth insulating layer IL4 and a third insulating layer IL3. The second connecting electrode BE2 may be electrically connected to a first connecting electrode BE1 which consists of a third conductive layer 130, via a contact hole that penetrates the fourth insulating layer IL4.

A fifth insulating layer IL5 is disposed on the fourth conductive layer 140, and the fifth conductive layer 150 is disposed on the fifth insulating layer IL6.

The fifth conductive layer 150 may include at least one metal selected from among Al, Mo, Pt, Pd, Ag, Mg, Au, Ni, Nd, Ir, Cr, Ca, Ti, Ta, W, and Cu. The fifth conductive layer 150 may be a single-layer film or a multilayer film. For example, the fifth conductive layer 150 may be formed to have a stack of Ti/A/Ti, Mo/Al/Mo, Mo/AlGe/Mo, or Ti/Cu. The fifth conductive layer 150 may be formed of the same material as the fourth conductive layer 140. However, exemplary embodiments of the present inventive concepts are not limited thereto.

The fifth conductive layer 140 may include a connecting wire DM_1 and a third connecting electrode BE3. In a cross-sectional view, the connecting wire DM_1 may overlap with the first power supply voltage line VDL_1. Accordingly, as described above, the coupling to between a gate electrode G1 of a first transistor T and the connecting wire DM_1 can be reduced.

The third connecting electrode BE3 may be electrically connected to a second connecting electrode BE2 which consists of the fourth conductive layer 140, via a contact hole that penetrates the fifth insulating layer IL5.

The sixth insulating layer IL6 may be disposed on the fifth conductive layer 150. The sixth insulating layer IL6 covers the fifth conductive layer 150. The sixth insulating layer IL6 may be a via layer. In an exemplary embodiment, the sixth insulating layer IL6 may include the same material as a bending insulating layer IL0 or may include at least one of the aforementioned exemplary materials that may be used to form the bending insulating layer IL0.

A first electrode layer 160 is disposed on the sixth insulating layer IL6. An anode electrode ANO of a pixel PX of the display device 1_3 may consist of the first electrode layer 160. The anode electrode ANO may be electrically connected to the third connecting electrode BE3, which consists of the fifth conductive layer 150, via a contact hole that penetrates the sixth insulating layer IL6.

A display device according to another exemplary embodiment of the present inventive concepts will hereinafter be described.

Figure 21:
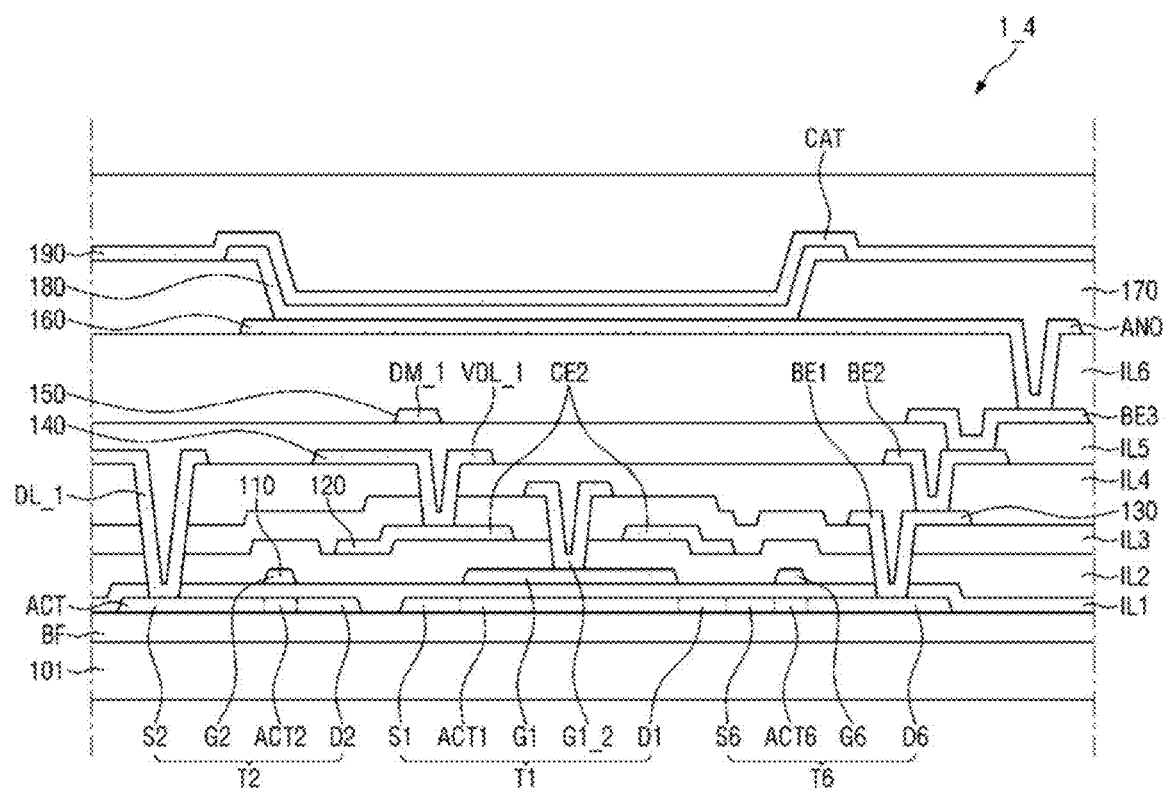
FIG. 21 is a cross-sectional view illustrating a pixel of a display device according to another exemplary embodiment of the present inventive concepts.

FIG. 21 is a cross-sectional view illustrating a pixel of a display device according to another exemplary embodiment of the present disclosure.

Referring to FIG. 21, a display device 1_4 differs from the display device 1_3 of FIG. 20 based on a fourth conductive layer 140 including a data line DL_1. The display device 1_4 of FIG. 21 is substantially the same as the display device 1_3 of FIG. 20 and thus will hereinafter be described, focusing mainly on the differences with the display device 1_3 of FIG. 20.

The fourth conductive layer 140 is disposed on a fourth insulating layer IL4. The fourth conductive layer 140 may include the data line DL_1, a first power supply voltage line VDL_1, and a second connecting electrode BE2. The data line DL_1 may be electrically connected to a source region S2 of a second transistor T2 which consists of a semiconductor layer ACT, via a contact hole that penetrates the fourth insulating layer IL4, a third insulating layer IL3, a second insulating layer IL2, and a first insulating layer IL1.

In concluding the detailed description, those skilled in the art will appreciate that many variations and modifications can be made to the preferred embodiments without substantially departing from the principles of the present invention. Therefore, the disclosed exemplary embodiments of the present inventive concepts are used in a generic and descriptive sense only and not for purposes of limitation.

What is claimed is:
1. A display device, comprising:
a first area including a display area;
a second area including a non-display area;
a third area connecting the first and second areas; and
a demultiplexing circuit unit disposed in the non-display area of the second area and overlapping with the first area in a direction of a thickness of the display device,
wherein signal wires including first signal wires and second signal wires are disposed in the third area,
wherein the first signal wires and the second signal wires are disposed on different layers.
2. The display device of claim 1, wherein:
the demultiplexing circuit unit includes a plurality of demultiplexers, and
the demultiplexers are configured to divide data signals and provide the divided data signals to the signal wires.
3. The display device of claim 1, further comprising:
a first conductive layer that includes gate electrodes;
a second conductive layer that includes second electrodes of storage capacitors;
a third conductive layer that includes first connecting electrodes; and
a first electrode layer that includes anode electrodes, wherein the anode electrodes are electrically connected to the first connecting electrodes.
4. The display device of claim 3, further comprising:
a fourth conductive layer that includes first power supply voltage lines; and
a fifth conductive layer that includes connecting wires,
wherein the connecting wires at least partially overlap with the first power supply voltage lines in the direction of the thickness of the display device.
5. The display device of claim 4, further including a plurality of insulating layers that separate the first, second, third, fourth, and fifth conductive layers from each other.
6. The display device of claim 5, further comprising:
the third conductive layer includes data lines, wherein the data lines and the connecting wires are electrically connected to each other.
7. The display device of claim 5, further comprising:
the fourth conductive layer includes data lines, wherein the data lines and the connecting wires are electrically connected to each other.
8. A display device, comprising:
a first area including a display area;
a second area including a non-display area;
a third area connecting the first and second areas;
a demultiplexing circuit unit disposed in the non-display area of the second area and overlapping with the first area in a direction of a thickness of the display device,
a first conductive layer that includes gate electrodes;
a second conductive layer that includes second electrodes of storage capacitors;
a third conductive layer that includes first connecting electrodes and data lines;
a first electrode layer that includes anode electrodes, wherein the anode electrodes are electrically connected to the first connecting electrodes; and a fourth conductive layer that includes connecting wires, wherein the data lines and the connecting wires are electrically connected to each other.

9. The display device of claim 8, further comprising:
the third conductive layer includes first power supply voltage lines, wherein the connecting wires at least partially overlap with the first power supply voltage lines in the direction of the thickness of the display device.

10. A display device, comprising:
a display panel including a bending area, a main area which is disposed on a first side of the bending area, and a sub-area which extends from a second side of the bending area; and
a demultiplexing circuit unit disposed in the sub-area, wherein a plurality of signal wires are disposed in the bending area, the plurality of signal wires includes first signal wires and second signal wires that are disposed on different layers.

11. The display device of claim 10, wherein:
the demultiplexing circuit unit includes a plurality of demultiplexers; and
the demultiplexers are configured to divide data signals and provide the divided data signals to pixels via the plurality of signal wires.

12. The display device of claim 10, wherein the demultiplexing circuit unit overlaps with the main area in a direction of a thickness of the display panel.

13. The display device of claim 12, further comprising:
a driving chip disposed in the sub-area, wherein the demultiplexing circuit unit is disposed between the bending area and the driving chip.

14. The display device of claim 10, wherein the display panel includes:
a first conductive layer that includes gate electrodes;
a second conductive layer that includes second electrodes of storage capacitors;
a third conductive layer that includes first connecting electrodes;
first electrodes that are electrically connected to the first connecting electrodes;
a pixel-defining layer that includes openings that expose the first electrodes; and
a light-emitting layer that is disposed in the openings of the pixel-defining layer.

15. A display device, comprising:
a display panel including a bending area, a main area which is disposed on a first side of the bending area, and a sub-area which extends from a second side of the bending area;
a demultiplexing circuit unit disposed in the sub-area;
wherein the display panel includes;
a first conductive layer that includes gate electrodes;
a second conductive layer that includes second electrodes of storage capacitors;
a third conductive layer that includes first connecting electrodes and data lines;
the first electrodes that are electrically connected to the first connecting electrodes;
a pixel-defining layer that includes openings that expose the first electrodes;
a light emitting layer that is disposed in the openings of the pixel-defining layer; and
a fourth conductive layer that includes connecting wire, wherein the data lines and the connecting wire are electrically connected to each other.

16. The display device of claim 15, wherein
the main area includes a display area and a non-display area,
the connecting wires are in direct contact with the data lines via contact holes that penetrate an insulating film disposed between the fourth conductive layer and the third conductive layer, and
the contact holes are disposed in the non-display area of the main area.

17. The display device of claim 16, further comprising:
the first conductive layer includes bending connecting wires; and
the fourth conductive layer includes signal wires,
wherein;
first ends of the bending connecting wires are electrically connected to the signal wires, and
second ends of the bending connecting wires are electrically connected to the connecting wires.

18. The display device of claim 17, further comprising:
the third conductive layer includes contact wires, wherein the signal wires and the bending connecting wires are electrically connected via the contact wires.

19. A display device, comprising:
a display area that includes:
a main display area disposed on a first plane; and
a plurality of sub-display areas connected to the main display area, the plurality of sub-display areas are not disposed on the first plane;
a non-display area that includes:
corner parts or round parts, the corner parts or round parts are disposed along outermost edges of each of the main display area and the plurality of sub-display areas,
wherein each of the corner parts is disposed between two adjacent sub-display areas of the plurality of sub-display areas;
a bending area connected to at least one of the sub-display areas; and
a sub-area connected to the bending area, the sub-area including a demultiplexing circuit disposed thereon,
Wherein the de-multiplexing circuit overlaps with the main display area in a direction of a thickness of the display device.

20. The display device of claim 19, wherein:
corner parts are disposed along the outermost edges of each of the main display area and the plurality of sub-display areas;
the plurality of sub-display areas are configured to be folded; and
each of the corner parts include first portions and second portions that are configured to be folded inwardly to face each other when the plurality of sub-display areas are folded.

* * * * *